(12) United States Patent
Jeong

(10) Patent No.: US 9,620,185 B1
(45) Date of Patent: Apr. 11, 2017

(54) VOLTAGE SUPPLY DEVICES GENERATING VOLTAGES APPLIED TO NONVOLATILE MEMORY CELLS

(71) Applicant: SK hynix Inc., Gyeonggi-do (KR)

(72) Inventor: Hoe Sam Jeong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/212,017

(22) Filed: Jul. 15, 2016

(30) Foreign Application Priority Data

Feb. 12, 2016 (KR) .......................... 10-2016-0016571

(51) Int. Cl.
| | | |
|---|---|---|
| *G11C 5/14* | (2006.01) | |
| *G11C 7/22* | (2006.01) | |
| *G11C 7/10* | (2006.01) | |
| *G11C 16/30* | (2006.01) | |
| *H02M 3/156* | (2006.01) | |
| *G05F 1/30* | (2006.01) | |
| *H01L 27/092* | (2006.01) | |
| *G11C 8/08* | (2006.01) | |
| *H01L 29/786* | (2006.01) | |
| *H03K 19/00* | (2006.01) | |

(52) U.S. Cl.
CPC .................. *G11C 7/22* (2013.01); *G11C 5/14* (2013.01); *G11C 5/145* (2013.01); *G11C 7/10* (2013.01); *G11C 16/30* (2013.01); *G05F 1/30* (2013.01); *G11C 8/08* (2013.01); *H01L 27/092* (2013.01); *H01L 29/78609* (2013.01); *H02M 3/156* (2013.01); *H03K 19/0016* (2013.01)

(58) Field of Classification Search
CPC .. G11C 5/14; G11C 5/145; G11C 8/08; G11C 16/30; H01L 27/092; H01L 29/78609; H03K 19/0016; H03K 19/01707; H02M 3/156; G05F 1/30
USPC ............ 365/189.09, 189.07, 185.23, 185.24, 365/185.11, 226; 323/283, 222, 223, 262; 327/534, 536, 537
See application file for complete search history.

(56) References Cited

U.S. PATENT DOCUMENTS

| | | | | |
|---|---|---|---|---|
| 4,263,664 A | * | 4/1981 | Owen | G11C 5/145 365/185.02 |
| 6,297,686 B1 | * | 10/2001 | Lin | H01L 27/092 257/E27.062 |
| 6,429,725 B1 | * | 8/2002 | Tanzawa | H02M 3/073 327/536 |
| 6,628,160 B2 | * | 9/2003 | Lin | H01L 27/092 257/E27.062 |
| 7,586,795 B2 | | 9/2009 | Kutz et al. | |

(Continued)

*Primary Examiner* — Gene Auduong
(74) *Attorney, Agent, or Firm* — IP & T Group LLP

(57) ABSTRACT

A voltage supply device includes a bias generator, a control signal generator and a cell switching circuit. The bias generator divides a first supply voltage to output a plurality of divided supply voltages. The control signal generator receives the plurality of divided supply voltages to generate a plurality of control signals. The cell switching circuit receives the plurality of control signals to provide nonvolatile memory cells with one or more of a ground voltage, the first supply voltage, or a second supply voltage different from the first supply voltage. Each of the bias generator, the control signal generator and the cell switching circuit is implemented with medium voltage MOS transistors having a breakdown voltage of from approximately 7 volts to approximately 15 volts.

23 Claims, 19 Drawing Sheets

(56) References Cited

U.S. PATENT DOCUMENTS 8,842,484 B2    9/2014   Kwon et al.

\* cited by examiner

VOLTAGE SUPPLY DEVICES GENERATING VOLTAGES APPLIED TO NONVOLATILE MEMORY CELLS

CROSS-REFERENCE TO RELATED APPLICATIONS

The present application claims priority under 35 U.S.C 119(a) to Korean Patent Application No. 10-2016-0016571, filed on Feb. 12, 2016, which is herein incorporated by references in its entirety.

BACKGROUND

1. Technical Field

Various embodiments of the present disclosure relate generally to voltage supply devices generating voltages for memory cells of semiconductor devices and, more particularly, to voltage supply devices generating voltages for nonvolatile memory cells.

2. Related Art

Semiconductor devices may receive a power supply voltage from an external device to operate. The power supply voltage provided by the external device typically has a constant level. In general, various voltages having different levels are used in operation of a semiconductor device. For example, at least a read voltage, an erase voltage and a program voltage (also, referred to as a write voltage) having different voltage levels are used in the operation of non-volatile memory (NVM) cells of a nonvolatile memory (NVM) device. Thus, it is generally necessary to supply various different voltages to the NVM cells using a voltage supply device in order to operate the NVM cells.

SUMMARY

Various embodiments are directed to an improved voltage supply device generating a plurality of voltages for operating a nonvolatile memory cell.

According to an embodiment, the voltage supply device includes a bias generator, a control signal generator and a cell switching circuit. The bias generator divides a first supply voltage to output a plurality of divided supply voltages. The control signal generator receives the plurality of divided supply voltages to generate a plurality of control signals. The cell switching circuit receives the plurality of control signals to provide nonvolatile memory cells with one or more of a ground voltage, the first supply voltage, or a second supply voltage different from the first supply voltage. Each of the bias generator, the control signal generator and the cell switching circuit is implemented with medium voltage MOS transistors having a breakdown voltage of from approximately 7 volts to approximately 15 volts.

BRIEF DESCRIPTION OF THE DRAWINGS

Various embodiments of the present invention will become more apparent in view of the attached drawings and accompanying detailed description, in which.

DETAILED DESCRIPTION OF THE EMBODIMENTS

Figure 1:
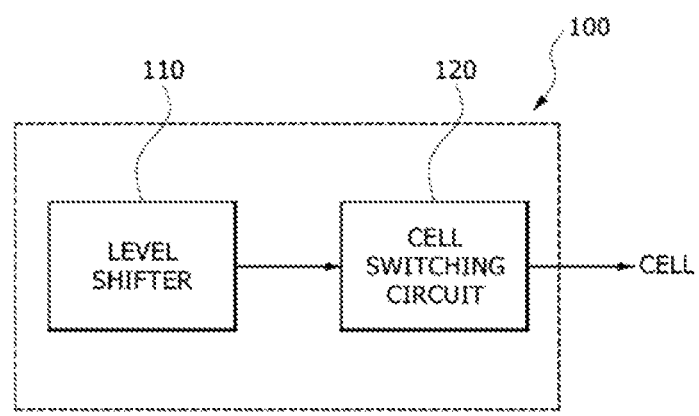
FIG. 1 is a block diagram illustrating a general voltage supply device generating voltages applied to nonvolatile memory cells.

The present invention will be described below with reference to the accompanying drawings through various embodiments.

The present invention, however, may be embodied in various different forms, and should not be construed as being limited to the illustrated embodiments herein. Rather, these embodiments are provided as examples so that this disclosure will be thorough and complete, and will fully convey the various aspects and features of the present invention to those skilled in the art.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a general voltage supply device 100 generating voltages applied to nonvolatile memory cells.

Referring to FIG. 1, the general voltage supply device 100 may include a level shifter 110 and a cell switching circuit 120.

The level shifter 110 may receive a supply voltage to generate and output a voltage having a different level from the supply voltage. In general, the level shifter 110 may generate a higher voltage than the supply voltage. The cell switching circuit 120 may act as a switch that selectively supplies the high voltage generated by the level shifter 110 to memory cells of a semiconductor device. That is, the high voltage may be supplied to the memory cells in addition to the supply voltage and a ground voltage. Thus, a program operation, an erase operation or a read operation may be performed to the memory cells using various different voltages such as the high voltage generated by the level shifter 110, the supply voltage inputted to the level shifter 110, and the ground voltage.

Figure 2:
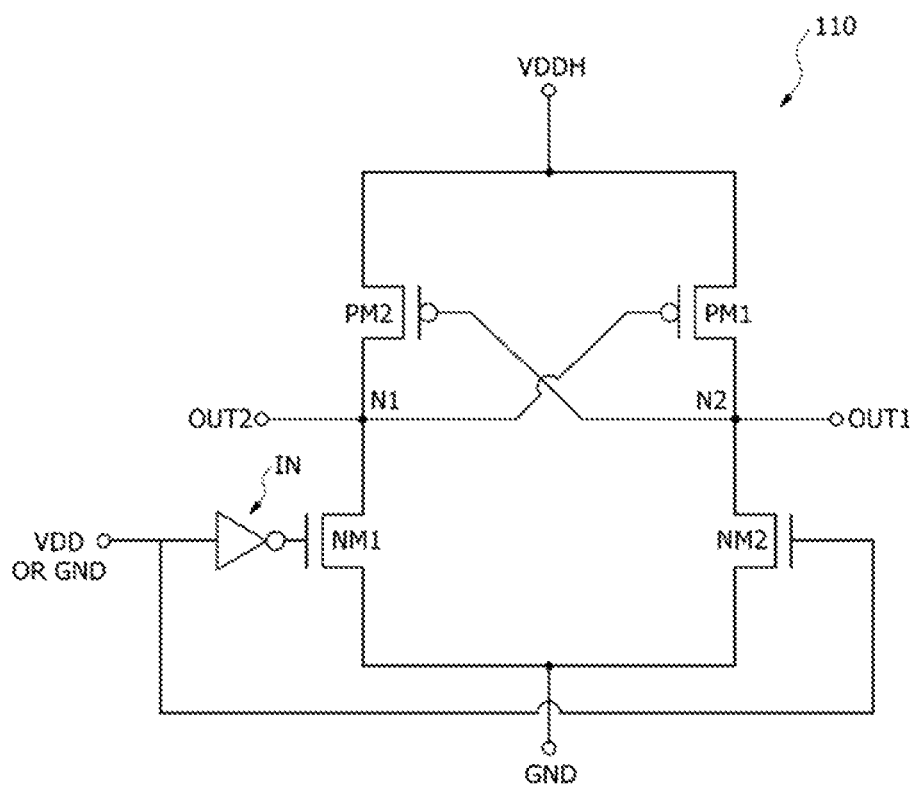
FIG. 2 is a circuit diagram of a level shifter included in the voltage supply device of FIG. 1.

FIG. 2 is a circuit diagram of the level shifter 110 included in the voltage supply device 100.

Referring to FIG. 2, the level shifter 110 may include a pair of NMOS transistors NM1 and NM2 and a pair of PMOS transistors PM1 and PM2 forming a cross-coupled latch structure. The source of the first NMOS transistor NM1 and the source of the second NMOS transistor NM2 are commonly coupled to a ground voltage GND. The drain of the first NMOS transistor NM1 and the drain of the second NMOS transistor NM2 are coupled to first and second nodes N1 and N2, respectively. The first node N1 is coupled to a second output node OUT2. The second node N2 is coupled to a first output node OUT1. The gate of the first NMOS transistor NM1 is coupled to an output node an inverter IN. The gate of the second NMOS transistor NM2 is coupled to an input node of the inverter IN. Thus, an input signal applied to the gate of the second NMOS transistor NM2 may be inverted and applied to the gate of the first NMOS transistor NM1. A supply voltage VDD or a ground voltage GND may be applied to the input node of the inverter IN. The sources of the first and second PMOS transistors PM1 and PM2 are both coupled to a supply voltage VDDH having a voltage that is higher than a supply voltage VDD. A drain of the first PMOS transistor PM1 is coupled to the second node N2 and a gate of the second PMOS transistor PM2. A drain of the second PMOS transistors PM2 is coupled to the first node N1 and the gate of the first PMOS transistor PM1.

In operation, when the supply voltage VDD is applied to the input node of the inverter IN, the first NMOS transistor NM1 may be turned off and the second NMOS transistor NM2 may be turned on. Since the second NMOS transistor NM2 is turned on, the ground voltage GND may be outputted through the first output node OUT1 which is coupled to the second node N2. Since the ground voltage GND is applied to the second node N2, the second PMOS transistors PM2 may be turned on and the high supply voltage VDDH may be outputted through the second output node OUT2 coupled to the first node N1.

When the ground voltage GND is applied to the input node of the inverter IN, the second NMOS transistor NM2 may be turned off and the first NMOS transistor NM1 may be turned on. Since the first NMOS transistor NM1 is turned on, the ground voltage GND may be outputted through the second output node OUT2 coupled to the first node N1. Since the ground voltage GND is applied to the first node N1, the first PMOS transistors PM1 may be turned on and the high supply voltage VDDH may be outputted through the first output node OUT1 coupled to the second node N2.

As such, according to the level shifter 110, an input signal having a range between the ground voltage GND and the supply voltage VDD may be converted into an output signal having a range between the ground voltage GND and the high supply voltage VDDH through the second output OUT2 and the first output OUT1. In such a case, the supply voltage VDD may correspond to a high voltage over 15 volts, for example, a high voltage of about 18 volts. Thus, the first and second NMOS transistors NM1 and NM2 and the first and second PMOS transistors PM1 and PM2 have to be realized using high voltage MOS transistors having a gate-source breakdown voltage and a drain-source breakdown voltage which are higher than the high supply voltage VDDH.

Figure 3:
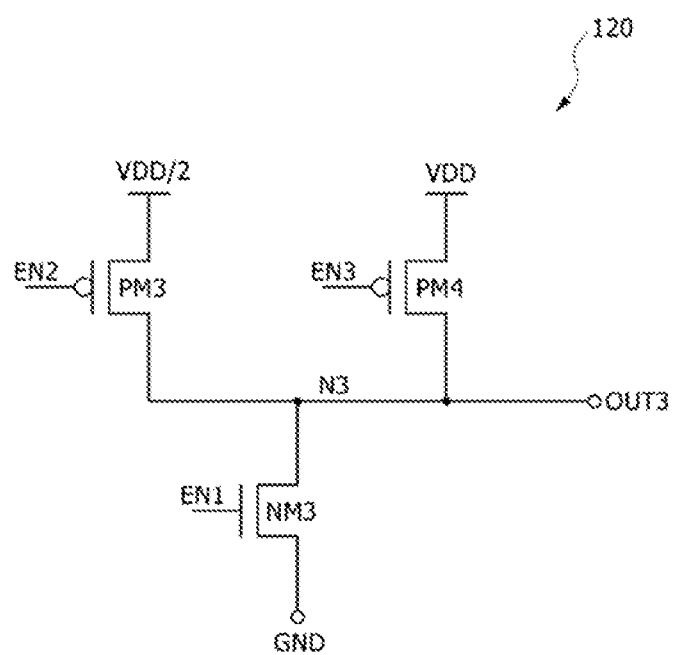
FIG. 3 is a circuit diagram of a cell switching circuit included in the voltage supply device of FIG. 1.

FIG. 3 is a circuit diagram of the cell switching circuit 120 included in the voltage supply device 100.

Referring to FIG. 3, the cell switching circuit 120 may include a pair of PMOS transistors PM3 and PM4 and an NMOS transistor NM3. A source and a drain of the first PMOS transistor PM3 may be coupled to a second supply voltage VDD/2 and a first node N3, respectively. The first node N3 may be coupled to an output node OUT3 of the cell switching circuit 120. A source and a drain of the second PMOS transistor PM4 may be coupled to a first supply voltage VDD and the first node N3, respectively. A drain and a source of the NMOS transistor NM3 may be coupled to the first node N3 and the ground voltage GND, respectively. First to third enablement signals EN1 to EN3 may be applied to the gates of the NMOS transistor NM3, the first PMOS transistor PM3 and the second PMOS transistor PM4, respectively.

When all of the first to third enablement signals EN1 to EN3 have the first supply voltage VDD, the NMOS transistor NM3 may be turned on and the first and second PMOS transistors PM3 and PM4 may be turned off. In such a case, the ground voltage GND may be outputted through the output node OUT3.

When the first and third enablement signals EN1 and EN3 have the ground voltage GND and the second enablement signal EN2 has the first supply voltage VDD, the second PMOS transistor PM4 may be turned on and the NMOS transistor NM3 and the first PMOS transistor PM3 may be turned off. In such a case, the first supply voltage VDD may be outputted through the output node OUT3.

When the first and second enablement signals EN1 and EN2 have the ground voltage GND and the third enablement signal EN3 has the first supply voltage VDD, the first PMOS transistor PM3 may be turned on and the NMOS transistor NM3 and the second PMOS transistor PM4 may be turned off. In such a case, the second supply voltage VDD/2 may be outputted through the output node OUT3.

As such, the cell switching circuit 120 may output the ground voltage GND, the first supply voltage VDD or the second supply voltage VDD/2 according to the voltage levels of the first to third enablement signals EN1 to EN3. The output voltage of the cell switching circuit 120 may be applied to memory cells of a semiconductor device. During the operation of the cell switching circuit 120, a high voltage over 15 volts (e.g., about 18 volts) may be applied to the NMOS transistor NM3 and the first and second PMOS transistors PM3 and PM4. Thus, the NMOS transistor NM3 and the first and second PMOS transistors PM3 and PM4 have to be realized using high voltage MOS transistors having a gate-source breakdown voltage and a drain-source breakdown voltage which are higher than 18 volts.

Figure 4:
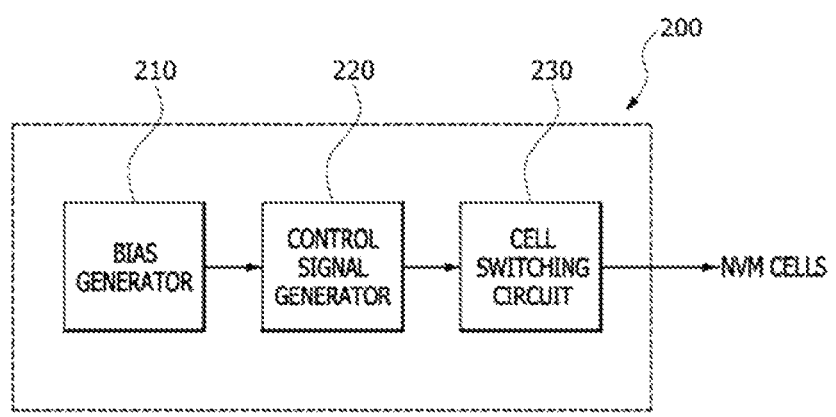
FIG. 4 is a block diagram illustrating a voltage supply device according to an embodiment of the present invention.

FIG. 4 is a block diagram illustrating a voltage supply device 200, according to an embodiment of the present invention.

The voltage supply device 200 may include only medium voltage MOS transistors. Specifically, referring to FIG. 4, the voltage supply device 200 may include a bias generator 210, a control signal generator 220 and a cell switching circuit 230.

The bias generator 210 may divide a supply voltage VDD to output a plurality of divided supply voltages. The control signal generator 220 may receive the divided supply voltages from the bias generator 210 to generate a plurality of control signals. The cell switching circuit 230 may receive the control signals and may supply various operation voltages to NVM cells. In the voltage supply device 200, according to the present embodiment, each of the bias generator 210, the control signal generator 220 and the cell switching circuit 230 may include one or more MOS transistors. Each of the MOS transistors may be a medium voltage MOS transistor having a gate-source breakdown voltage and a drain-source breakdown voltage that correspond to a mid-level voltage between approximately 7 volts and approximately 15 volts. That is, no high voltage MOS transistors are employed in the voltage supply device 200. Thus, voltages applied between the gate and the source as well as between the drain and the source of each of the medium voltage MOS transistors should be lower than a gate-source breakdown voltage and a drain-source breakdown voltage of the medium voltage MOS transistors. A configuration and an operation of the voltage supply device 200 comprised of the medium voltage MOS transistors will be described in detail hereinafter.

Figure 5:
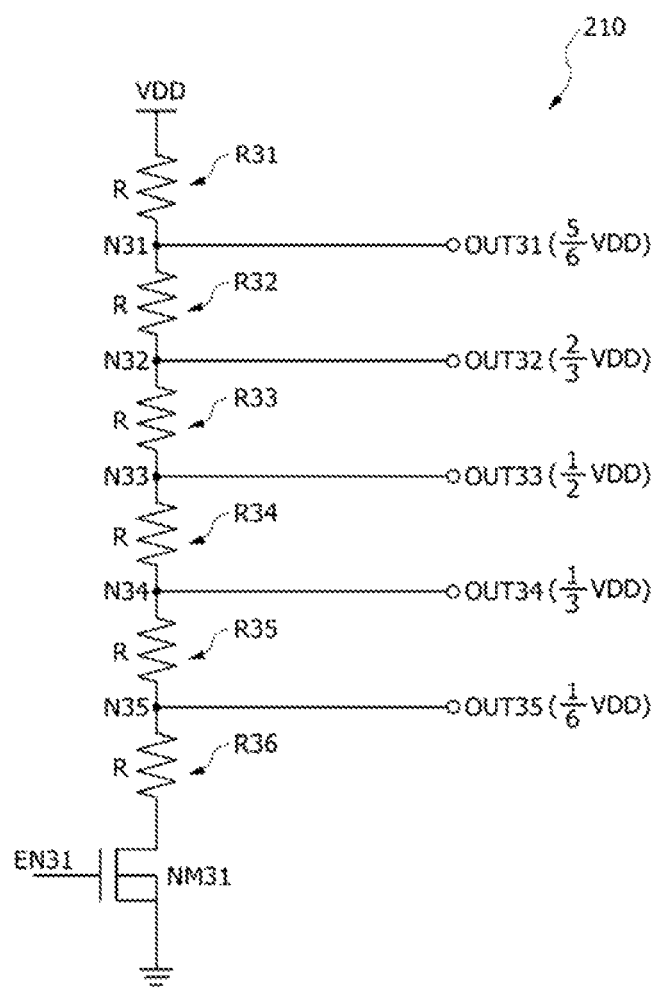
FIG. 5 is a circuit diagram illustrating a bias generator included in the voltage supply device of FIG. 4, according to an embodiment of the present invention.

FIG. 5 is a circuit diagram illustrating the bias generator 210 included in the voltage supply device 200.

Referring to FIG. 5, the bias generator 210 may include a plurality of resistors R31 to R36 and an NMOS transistor NM31 which are coupled in series between a first supply voltage VDD and a ground voltage GND. Although FIG. 5 illustrates an example in which the number of the resistors R31 to R36 is six, the present disclosure is not limited thereto. For example, the number of the resistors coupled in series between the first supply voltage VDD and the ground voltage GND may be greater than or less than six.

In an embodiment, each of the plurality of resistors R31 to R36 may have substantially the same resistance value R. The first resistor R31 may be coupled between the first supply voltage VDD and a first node N31, and the first node N31 may be coupled to a first output node OUT31. The second resistor R32 may be coupled between the first node N31 and a second node N32, and the second node N32 may be coupled to a second output node OUT32. The third resistor R33 may be coupled between the second node N32 and a third node N33, and the third node N33 may be coupled to a third output node OUT33. The fourth resistor R34 may be coupled between the third node N33 and a fourth node N34, and the fourth node N34 may be coupled to a fourth output node OUT34. The fifth resistor R35 may be coupled between the fourth node N34 and a fifth node N35, and the fifth node N35 may be coupled to a fifth output node OUT35. The sixth resistor R36 may be coupled between the fifth node N35 and a drain of the NMOS transistor NM31.

A source of the NMOS transistor NM31 may be coupled to the ground voltage GND. An enablement signal EN31 may be inputted to a gate of the NMOS transistor NM31. The source of the NMOS transistor NM31 may be coupled to a bulk of the NMOS transistor NM31. Thus, the source and the bulk of the NMOS transistor NM31 may have substantially the same potential.

When the enablement signal EN31 inputted to the gate of the NMOS transistor NM31 has a high level voltage, for example, +6 volts, the NMOS transistor NM31 may be turned on and a current path may be provided between the first supply voltage VDD and the ground voltage GND. In such a case, since the resistors R31 to R36 have the same resistance value R, voltage drops generated across the resistors R31 to R36 may have the same value and a plurality of divided supply voltages may be outputted through the first to fifth output nodes OUT31 to OUT35. A first divided supply voltage (5×VDD/6) may be outputted through the first output node OUT31, and a second divided supply voltage (2×VDD/3) may be outputted through the second output node OUT32. In addition, a third divided supply voltage (0.5×VDD) may be outputted through the third output node OUT33, a fourth divided supply voltage (VDD/3) may be outputted through the fourth output node OUT34, and a fifth divided supply voltage (VDD/6) may be outputted through the fifth output node OUT35.

In an embodiment, when the first supply voltage VDD is +18 volts, divided supply voltages of +15 volts, +12 volts, +9 volts, +6 volts and +3 volts may be outputted through the first to fifth output nodes OUT31, OUT32, OUT33, OUT34 and OUT35, respectively. The divided supply voltages of +15 volts, +12 volts, +9 volts, +6 volts and +3 volts may be inputted to the control signal generator 220.

The NMOS transistor NM31 employed in the bias generator 210 may function as a switch coupled between the sixth resistor R36 and the ground voltage GND. Thus, the enablement signal EN31 applied to the gate of the NMOS transistor NM31 should have a voltage level (e.g., +6 volts) higher than a threshold voltage of the NMOS transistor NM31 in order to turn on the NMOS transistor NM31. In such a case, a voltage difference between the gate and the source of the NMOS transistor NM31 may be 6 volts, and a voltage difference between the drain and the source of the NMOS transistor NM31 may be 0 volt. That is, voltages lower than about 10 volts corresponding to a drain junction breakdown voltage of a medium voltage MOS transistor may be applied between the gate and the source as well as between the drain and the source of the NMOS transistor NM31. Accordingly, the NMOS transistor NM31 may be implemented with a medium voltage MOS transistor.

Figure 6:
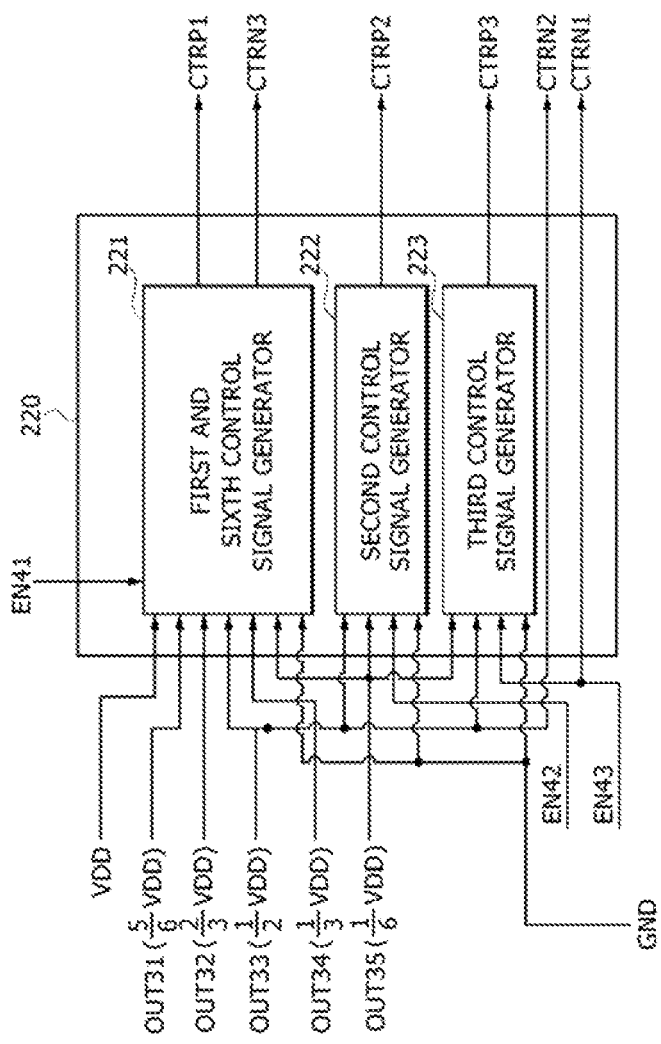
FIG. 6 is a block diagram illustrating a control signal generator included in the voltage supply device of FIG. 4, according to an embodiment of the present invention.

FIG. 6 is a block diagram illustrating an example of a control signal generator 220 included in the voltage supply device 200, according to an embodiment of the present invention.

Referring to FIG. 6, the control signal generator 220 may include a first and sixth control signal generator 221, a second control signal generator 222 and a third control signal generator 223.

The first and sixth control signal generator 221 may be coupled to the first to fifth output nodes OUT31 to OUT35 of the bias generator 210. Thus, the first and sixth control signal generator 221 may receive the first to fifth divided supply voltages 5×VDD/6, 2×VDD/3, 0.5×VDD, VDD/3 and VDD/6. In addition, the first and sixth control signal generator 221 may also receive a first enablement signal EN41, the ground voltage GND and the first supply voltage VDD. The first and sixth control signal generator 221 may generate and output a first control signal CTRP1 and a sixth control signal CTRN3 from the first enablement signal EN41 and the first to fifth divided supply voltages 5×VDD/6, 2×VDD/3, 0.5×VDD, VDD/3 and VDD/6.

The second control signal generator 222 may be coupled to the third output node OUT33 and the fifth output node OUT35 of the bias generator 210. Thus, the second control signal generator 222 may receive the third and fifth divided supply voltages 0.5×VDD and VDD/6. In addition, the second control signal generator 222 may also receive a second enablement signal EN42 and the ground voltage GND. The second control signal generator 222 may generate and output a second control signal CTRP2 from the second enablement signal EN42, the third divided supply voltage 0.5×VDD and the fifth divided supply voltage VDD/6.

The third control signal generator 223 may be coupled to the third output node OUT33 and the fifth output node OUT35 of the bias generator 210. Thus, the third control signal generator 223 may receive the third and fifth divided supply voltages 0.5×VDD and VDD/6. In addition, the third control signal generator 223 may also receive a third enablement signal EN43 and the ground voltage GND. The third control signal generator 223 may generate and output a third control signal CTRP3 from the third enablement signal EN43, the third divided supply voltage 0.5×VDD and the fifth divided supply voltage VDD/6.

The control signal generator 220 may output the third enablement signal EN43 as a fourth control signal CTRN1 of the control signal generator 220. The control signal generator 220 may also output the third divided supply voltage 0.5×VDD as a fifth control signal CTRN2 of the control signal generator 220.

Figure 7:
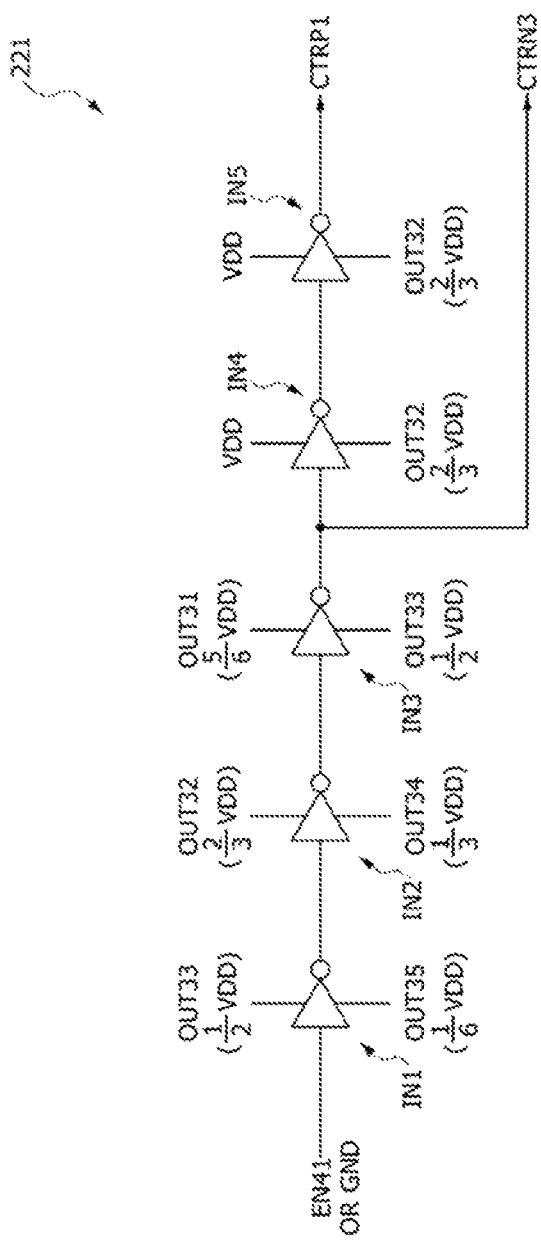
FIG. 7 is a logic circuit diagram illustrating a first and sixth control signal generator included in the control signal generator of FIG. 6, according to an embodiment of the present invention.
Figure 8:
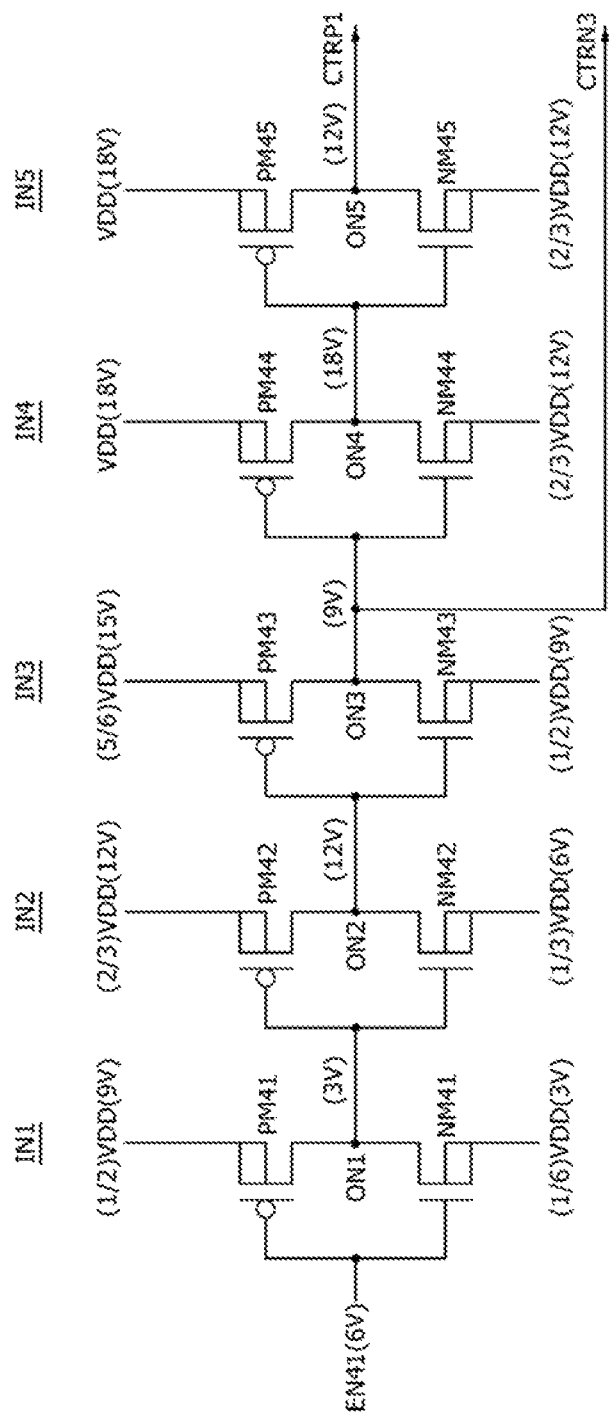
FIGS. 8 and 9 are circuit diagrams illustrating operations of the first and sixth control signal generators shown in FIG. 7, according to an embodiment of the present invention.
Figure 9:
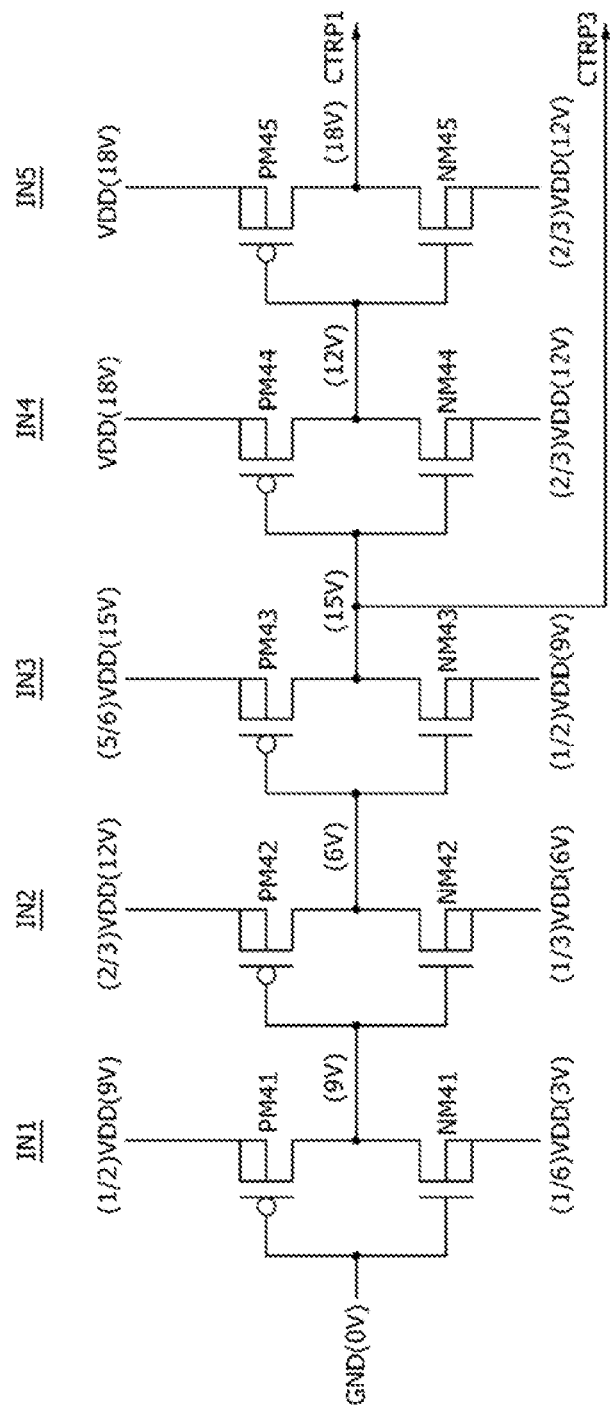

FIG. 7 is a logic circuit diagram illustrating the first and sixth control signal generator 221 included in the control signal generator 220. FIGS. 8 and 9 are circuit diagrams illustrating operations of the first and sixth control signal generator 221.

Referring to FIGS. 7 to 9, the first and sixth control signal generator 221 may include a plurality of cascaded inverters IN1 to IN5.

The first inverter IN1 may receive the first enablement signal EN41 or the ground voltage GND. An output node of the first inverter IN1 may be directly coupled to an input node of the second inverter IN2. An output node of the second inverter IN2 may be directly coupled to an input node of the third inverter IN3. The sixth control signal CTRN3 may be outputted through an output node of the third inverter IN3. The output node of the third inverter IN3 may be directly coupled to an input node of the fourth inverter IN4. An output node of the fourth inverter IN4 may be directly coupled to an input node of the fifth inverter IN5. The first control signal CTRP1 may be outputted through an output node of the fifth inverter IN5.

Each of the first to fifth inverters IN1 to IN5 may be realized using a CMOS inverter. The first inverter IN1 may include a first PMOS transistor PM41 and a first NMOS transistor NM41 which are coupled in series between the third output node OUT33 and the fifth output node OUT35 of the bias generator 210. A transconductance (Gm) of the first NMOS transistor NM41 may be greater than a transconductance of the first PMOS transistor PM41. In such a case, an area occupied by the first NMOS transistor NM41 may be greater than an area occupied by the first PMOS transistor PM41. A source and a bulk of the first NMOS transistor NM41 may be coupled to each other. Thus, the same bias may be applied to the source and the bulk of the first NMOS transistor NM41. A source and a bulk of the first PMOS transistor PM41 may be coupled to each other. Thus, the same bias may be applied to the source and the bulk of the first PMOS transistor PM41. Gates of the first NMOS transistor NM41 and the first PMOS transistor PM41 may be commonly coupled to a single input line. The source of the first NMOS transistor NM41 may be coupled to the fifth output node OUT35. Thus, the fifth divided supply voltage VDD/6 may be applied to the source of the first NMOS transistor NM41. The source of the first PMOS transistor PM41 may be coupled to the third output node OUT33. Thus, the third divided supply voltage 0.5×VDD may be applied to the source of the first PMOS transistor PM41. Drains of the first NMOS transistor NM41 and the first PMOS transistor PM41 may be coupled to each other to constitute an output node ON1 of the first inverter IN1.

The second inverter IN2 may include a second PMOS transistor PM42 and a second NMOS transistor NM42 which are coupled in series between the second output node OUT32 and the fourth output node OUT34 of the bias generator 210. A transconductance of the second NMOS transistor NM42 may be greater than a transconductance of the second PMOS transistor PM42. In such a case, an area occupied by the second NMOS transistor NM42 may be greater than an area occupied by the second PMOS transistor PM42. A source and a bulk of the second NMOS transistor NM42 may be coupled to each other. Thus, the same bias may be applied to the source and the bulk of the second NMOS transistor NM42. A source and a bulk of the second PMOS transistor PM42 may be coupled to each other. Thus, the same bias may be applied to the source and the bulk of the second PMOS transistor PM42. Gates of the second NMOS transistor NM42 and the second PMOS transistor PM42 may be coupled to the output node ON1 of the first inverter IN1. The source of the second NMOS transistor NM42 may be coupled to the fourth output node OUT34. Thus, the fourth divided supply voltage VDD/3 may be applied to the source of the second NMOS transistor NM42. The source of the second PMOS transistor PM42 may be coupled to the second output node OUT32. Thus, the second divided supply voltage 2×VDD/3 may be applied to the source of the second PMOS transistor PM42. Drains of the second NMOS transistor NM42 and the second PMOS transistor PM42 may be coupled to each other to constitute an output node ON2 of the second inverter IN2.

The third inverter IN3 may include a third PMOS transistor PM43 and a third NMOS transistor NM43 which are coupled in series between the first output node OUT31 and the third output node OUT33 of the bias generator 210. A transconductance of the third NMOS transistor NM43 may be greater than a transconductance of the third PMOS transistor PM43. In such a case, an area occupied by the third NMOS transistor NM43 may be greater than an area occupied by the third PMOS transistor PM43. A source and a bulk of the third NMOS transistor NM43 may be coupled to each other. Thus, the same bias may be applied to the source and the bulk of the third NMOS transistor NM43. A source and a bulk of the third PMOS transistor PM43 may be coupled to each other. Thus, the same bias may be applied to the source and the bulk of the third PMOS transistor PM43. Gates of the third NMOS transistor NM43 and the third PMOS transistor PM43 may be coupled to the output node of the second inverter IN2. The source of the third NMOS transistor NM43 may be coupled to the third output node OUT33. Thus, the third divided supply voltage 0.5× VDD may be applied to the source of the third NMOS transistor NM43. The source of the third PMOS transistor PM43 may be coupled to the first output node OUT31. Thus, the first divided supply voltage 5×VDD/6 may be applied to the source of the third PMOS transistor PM43. Drains of the third NMOS transistor NM43 and the third PMOS transistor PM43 may be coupled to each other to constitute an output node ON3 of the third inverter IN3. The sixth control signal CTRN3 may be outputted through the output node of the third inverter IN3.

The fourth inverter IN4 may include a fourth PMOS transistor PM44 and a fourth NMOS transistor NM44 which are coupled in series between the first supply voltage VDD and the second output node OUT32 of the bias generator 210. A transconductance of the fourth NMOS transistor NM44 may be greater than a transconductance of the fourth PMOS transistor PM44. In such a case, an area occupied by the fourth NMOS transistor NM44 may be greater than an area occupied by the fourth PMOS transistor PM44. A source and a bulk of the fourth NMOS transistor NM44 may be coupled to each other. Thus, the same bias may be applied to the source and the bulk of the fourth NMOS transistor NM44. A source and a bulk of the fourth PMOS transistor PM44 may be coupled to each other. Thus, the same bias may be applied to the source and the bulk of the fourth PMOS transistor PM44. Gates of the fourth NMOS transistor NM44 and the fourth PMOS transistor PM44 may be coupled to the output node of the third inverter IN3. The source of the fourth NMOS transistor NM44 may be coupled to the second output node OUT32. Thus, the second divided supply voltage 2×VDD/3 may be applied to the source of the fourth NMOS transistor NM44. The source of the fourth PMOS transistor PM44 may be coupled to the first supply voltage VDD. Thus, the first supply voltage VDD may be applied to the source of the fourth PMOS transistor PM44. Drains of the fourth NMOS transistor NM44 and the fourth PMOS transistor PM44 may be coupled to each other to constitute an output node ON4 of the fourth inverter IN4.

The fifth inverter IN5 may include a fifth PMOS transistor PM45 and a fifth NMOS transistor NM45 which are coupled in series between the first supply voltage VDD and the second output node OUT32 of the bias generator 210. A transconductance of the fifth NMOS transistor NM45 may be greater than a transconductance of the fifth PMOS transistor PM45. In such a case, an area occupied by the fifth NMOS transistor NM45 may be greater than an area occupied by the fifth PMOS transistor PM45. A source and a bulk of the fifth NMOS transistor NM45 may be coupled to each other. Thus, the same bias may be applied to the source and the bulk of the fifth NMOS transistor NM45. A source and a bulk of the fifth PMOS transistor PM45 may be coupled to each other. Thus, the same bias may be applied to the source and the bulk of the fifth PMOS transistor PM45. Gates of the fifth NMOS transistor NM45 and the fifth PMOS transistor PM45 may be coupled to the output node of the fourth inverter IN4. The source of the fifth NMOS transistor NM45 may be coupled to the second output node OUT32. Thus, the second divided supply voltage 2×VDD/3 may be applied to the source of the fifth NMOS transistor NM45. The source of the fifth PMOS transistor PM45 may be coupled to the first supply voltage VDD. Thus, the first supply voltage VDD may be applied to the source of the fifth PMOS transistor PM45. Drains of the fifth NMOS transistor NM45 and the fifth PMOS transistor PM45 may be coupled to each other to constitute an output node ON5 of the fifth inverter IN5. The first control signal CTRP1 may be outputted through the output node of the fifth inverter IN5.

As illustrated in FIG. 8, when the first supply voltage VDD is 18 volts and the first enablement signal EN41 of 6 volts is applied to the input node of the first inverter IN1, the gate of the first NMOS transistor NM41 may have a voltage level higher than the bulk of the first NMOS transistor NM41 by 3 volts and the gate of the first PMOS transistor PM41 may have a voltage level lower than the bulk of the first PMOS transistor PM41 by 3 volts. Since the transconductance of the first NMOS transistor NM41 is greater than the transconductance of the first PMOS transistor PM41, 3 volts corresponding to the fifth divided supply voltage VDD/6 applied to the source of the first NMOS transistor NM41 may be outputted through the output node ON1 of the first inverter IN1.

In such a case, a voltage difference between the gate and the source of the first NMOS transistor NM41 may be 3 volts, and a voltage difference between the drain and the source of the first NMOS transistor NM41 may be 0 volt. In addition, a voltage difference between the gate and the source of the first PMOS transistor PM41 may be 3 volts, and a voltage difference between the drain and the source of the first PMOS transistor PM41 may be 6 volts. Accordingly, voltages lower than about 10 volts corresponding to a gate-source breakdown voltage and a drain-source breakdown voltage of the medium voltage MOS transistors may be applied between the gate and the source as well as between the drain and the source of each of the first NMOS transistor NM41 and the first PMOS transistor PM41.

An output voltage of 3 volts of the first inverter IN1 may be applied to the input node of the second inverter IN2. Thus, the gate of the second NMOS transistor NM42 may have a voltage level lower than the bulk of the second NMOS transistor NM42 by 3 volts and the gate of the second PMOS transistor PM42 may have a voltage level lower than the bulk of the second PMOS transistor PM42 by 9 volts. As a result, the second NMOS transistor NM42 may be turned off, and the second PMOS transistor PM42 may be turned on. Accordingly, 12 volts corresponding to the second divided supply voltage 2×VDD/3 applied to the source of the second PMOS transistor PM42 may be outputted through the output node ON2 of the second inverter IN2.

In such a case, a voltage difference between the gate and the source of the second NMOS transistor NM42 may be 3 volts, and a voltage difference between the drain and the source of the second NMOS transistor NM42 may be 6 volts. In addition, a voltage difference between the gate and the source of the second PMOS transistor PM42 may be 9 volts, and a voltage difference between the drain and the source of the second PMOS transistor PM42 may be 0 volt. Accordingly, voltages lower than about 10 volts corresponding to a gate-source breakdown voltage and a drain-source breakdown voltage of the medium voltage MOS transistors may be applied between the gate and the source as well as between the drain and the source of each of the second NMOS transistor NM42 and the second PMOS transistor PM42.

An output voltage of 12 volts of the second inverter IN2 may be applied to the input node of the third inverter IN3. Thus, the gate of the third NMOS transistor NM43 may have a voltage level higher than the bulk of the third NMOS transistor NM43 by 3 volts, and the gate of the third PMOS transistor PM43 may have a voltage level lower than the bulk of the third PMOS transistor PM43 by 3 volts. Since the transconductance of the third NMOS transistor NM43 is greater than the transconductance of the third PMOS transistor PM43, 9 volts corresponding to the third divided supply voltage 0.5×VDD applied to the source of the third NMOS transistor NM43 may be outputted through the output node ON3 of the third inverter IN3. The third divided supply voltage 0.5×VDD (i.e., 9 volts) outputted from the output node of the third inverter IN3 may be used as the sixth control signal CTRN3.

In such a case, a voltage difference between the gate and the source of the third NMOS transistor NM43 may be 3 volts, and a voltage difference between the drain and the source of the third NMOS transistor NM43 may be 0 volt. In addition, a voltage difference between the gate and the source of the third PMOS transistor PM43 may be 3 volts, and a voltage difference between the drain and the source of the third PMOS transistor PM43 may be 6 volts. Accordingly, voltages lower than about 10 volts corresponding to a gate-source breakdown voltage and a drain-source breakdown voltage of the medium voltage MOS transistors may be applied between the gate and the source as well as between the drain and the source of each of the third NMOS transistor NM43 and the third PMOS transistor PM43.

An output voltage of 9 volts of the third inverter IN3 may be applied to the input node of the fourth inverter IN4. Thus, the gate of the fourth NMOS transistor NM44 may have a voltage level lower than the bulk of the fourth NMOS transistor NM44 by 3 volts, and the gate of the fourth PMOS transistor PM44 may have a voltage level lower than the bulk of the fourth PMOS transistor PM44 by 9 volts. Thus, the fourth NMOS transistor NM44 may be turned off, and the fourth PMOS transistor PM44 may be turned on. Accordingly, 18 volts corresponding to the first supply voltage VDD applied to the source of the fourth PMOS transistor PM44 may be outputted through the output node ON4 of the fourth inverter IN4.

In such a case, a voltage difference between the gate and the source of the fourth NMOS transistor NM44 may be 3 volts, and a voltage difference between the drain and the source of the fourth NMOS transistor NM44 may be 6 volts. In addition, a voltage difference between the gate and the source of the fourth PMOS transistor PM44 may be 9 volts, and a voltage difference between the drain and the source of the fourth PMOS transistor PM44 may be 0 volt. Accordingly, voltages lower than about 10 volts corresponding to a gate-source breakdown voltage and a drain-source breakdown voltage of the medium voltage MOS transistors may be applied between the gate and the source as well as between the drain and the source of each of the fourth NMOS transistor NM44 and the fourth PMOS transistor PM44.

An output voltage of 18 volts of the fourth inverter IN4 may be applied to the input node of the fifth inverter IN5. Thus, the gate of the fifth NMOS transistor NM45 may have a voltage level higher than the bulk of the fifth NMOS transistor NM45 by 6 volts, and the gate of the fifth PMOS transistor PM45 may have a voltage level equal to that of the bulk of the fifth PMOS transistor PM45. Thus, the fifth NMOS transistor NM45 may be turned on, and the fifth PMOS transistor PM45 may be turned off. Accordingly, 12 volts corresponding to the second divided supply voltage 2×VDD/3 applied to the source of the fifth NMOS transistor NM45 may be outputted through the output node of the fifth inverter IN5. The second divided supply voltage 2×VDD/3 (i.e., 12 volts) outputted from the output node ON5 of the fifth inverter IN5 may be used as the first control signal CTRP1.

In such a case, a voltage difference between the gate and the source of the fifth NMOS transistor NM45 may be 6 volts, and a voltage difference between the drain and the source of the fifth NMOS transistor NM45 may be 0 volt. In addition, a voltage difference between the gate and the source of the fifth PMOS transistor PM45 may be 0 volt, and a voltage difference between the drain and the source of the fifth PMOS transistor PM45 may be 6 volts. Accordingly, voltages lower than about 10 volts corresponding to a gate-source breakdown voltage and a drain-source breakdown voltage of the medium voltage MOS transistors may be applied between the gate and the source as well as between the drain and the source of each of the fifth NMOS transistor NM45 and the fifth PMOS transistor PM45.

As illustrated in FIG. 9, when the first supply voltage VDD is 18 volts and the ground voltage GND is applied to the input node of the first inverter IN1, the gate of the first NMOS transistor NM41 may have a voltage level lower than the bulk of the first NMOS transistor NM41 by 3 volts and the gate of the first PMOS transistor PM41 may have a voltage level lower than the bulk of the first PMOS transistor PM41 by 9 volts. Thus, the first NMOS transistor NM41 may be turned off, and the first PMOS transistor PM41 may be turned on. As a result, 9 volts corresponding to the third divided supply voltage 0.5×VDD applied to the source of the first PMOS transistor PM41 may be outputted through the output node ON1 of the first inverter IN1.

In such a case, a voltage difference between the gate and the source of the first NMOS transistor NM41 may be 3 volts, and a voltage difference between the drain and the source of the first NMOS transistor NM41 may be 6 volts. In addition, a voltage difference between the gate and the source of the first PMOS transistor PM41 may be 9 volts, and a voltage difference between the drain and the source of the first PMOS transistor PM41 may be 0 volt. Accordingly, voltages lower than about 10 volts corresponding to a gate-source breakdown voltage and a drain-source breakdown voltage of the medium voltage MOS transistors may be applied between the gate and the source as well as between the drain and the source of each of the first NMOS transistor NM41 and the first PMOS transistor PM41.

An output voltage of 9 volts of the first inverter IN1 may be applied to the input node of the second inverter IN2. Thus, the gate of the second NMOS transistor NM42 may have a voltage level higher than the bulk of the second NMOS transistor NM42 by 3 volts, and the gate of the second PMOS transistor PM42 may have a voltage level lower than the bulk of the second PMOS transistor PM42 by 3 volts. Since the transconductance of the second NMOS transistor NM42 is greater than the transconductance of the second PMOS transistor PM42, 6 volts corresponding to the fourth divided supply voltage VDD/3 applied to the source of the second NMOS transistor NM42 may be outputted through the output node ON2 of the second inverter IN2.

In such a case, a voltage difference between the gate and the source of the second NMOS transistor NM42 may be 3 volts, and a voltage difference between the drain and the source of the second NMOS transistor NM42 may be 0 volt. In addition, a voltage difference between the gate and the source of the second PMOS transistor PM42 may be 3 volts, and a voltage difference between the drain and the source of the second PMOS transistor PM42 may be 6 volts. Accordingly, voltages lower than about 10 volts corresponding to a gate-source breakdown voltage and a drain-source breakdown voltage of the medium voltage MOS transistors may be applied between the gate and the source as well as between the drain and the source of each of the second NMOS transistor NM42 and the second PMOS transistor PM42.

An output voltage of 6 volts of the second inverter IN2 may be applied to the input node of the third inverter IN3. Thus, the gate of the third NMOS transistor NM43 may have a voltage level lower than the bulk of the third NMOS transistor NM43 by 3 volts, and the gate of the third PMOS transistor PM43 may have a voltage level lower than the bulk of the third PMOS transistor PM43 by 9 volts. Thus, the third NMOS transistor NM43 may be turned off, and the third PMOS transistor PM43 may be turned on. As a result, 15 volts corresponding to the first divided supply voltage 5×VDD/6 applied to the source of the third PMOS transistor PM43 may be outputted through the output node of the third inverter IN3. The first divided supply voltage 5×VDD/6 (i.e., 15 volts) outputted from the output node ON3 of the third inverter IN3 may be used as the sixth control signal CTRN3.

In such a case, a voltage difference between the gate and the source of the third NMOS transistor NM43 may be 3 volts, and a voltage difference between the drain and the source of the third NMOS transistor NM43 may be 6 volts. In addition, a voltage difference between the gate and the source of the third PMOS transistor PM43 may be 9 volts, and a voltage difference between the drain and the source of the third PMOS transistor PM43 may be 0 volt. Accordingly, voltages lower than about 10 volts corresponding to a gate-source breakdown voltage and a drain-source breakdown voltage of the medium voltage MOS transistors may be applied between the gate and the source as well as between the drain and the source of each of the third NMOS transistor NM43 and the third PMOS transistor PM43.

An output voltage of 15 volts of the third inverter IN3 may be applied to the input node of the fourth inverter IN4. Thus, the gate of the fourth NMOS transistor NM44 may have a voltage level higher than the bulk of the fourth NMOS transistor NM44 by 3 volts, and the gate of the fourth PMOS transistor PM44 may have a voltage level lower than the bulk of the fourth PMOS transistor PM44 by 3 volts. Since the transconductance of the fourth NMOS transistor NM44 is greater than the transconductance of the fourth PMOS transistor PM44, 12 volts corresponding to the second divided supply voltage 2×VDD/3 applied to the source of the fourth NMOS transistor NM44 may be outputted through the output node ON4 of the fourth inverter IN4.

In such a case, a voltage difference between the gate and the source of the fourth NMOS transistor NM44 may be 3 volts, and a voltage difference between the drain and the source of the fourth NMOS transistor NM44 may be 0 volt. In addition, a voltage difference between the gate and the source of the fourth PMOS transistor PM44 may be 3 volts, and a voltage difference between the drain and the source of the fourth PMOS transistor PM44 may be 6 volts. Accordingly, voltages lower than about 10 volts corresponding to a gate-source breakdown voltage and a drain-source breakdown voltage of the medium voltage MOS transistors may be applied between the gate and the source as well as between the drain and the source of each of the fourth NMOS transistor NM44 and the fourth PMOS transistor PM44.

An output voltage of 12 volts of the fourth inverter IN4 may be applied to the input node of the fifth inverter IN5. Thus, the gate of the fifth NMOS transistor NM45 may have a voltage level equal to that of the bulk of the fifth NMOS transistor NM45, and the gate of the fifth PMOS transistor PM45 may have a voltage level lower than the bulk of the fifth PMOS transistor PM45 by 6 volts. Accordingly, the fifth PMOS transistor PM45 may be turned on, and the fifth NMOS transistor NM45 may be turned off. As a result, 18 volts corresponding to the first supply voltage VDD applied to the source of the fifth PMOS transistor PM45 may be outputted through the output node of the fifth inverter IN5. The first supply voltage VDD (i.e., 18 volts) outputted from the output node ON5 of the fifth inverter IN5 may be used as the first control signal CTRP1.

In such a case, a voltage difference between the gate and the source of the fifth NMOS transistor NM45 may be 0 volt, and a voltage difference between the drain and the source of the fifth NMOS transistor NM45 may be 6 volts. In addition, a voltage difference between the gate and the source of the fifth PMOS transistor PM45 may be 6 volts, and a voltage difference between the drain and the source of the fifth PMOS transistor PM45 may be 0 volt. Accordingly, voltages lower than about 10 volts corresponding to a gate-source breakdown voltage and a drain-source breakdown voltage of the medium voltage MOS transistors may be applied between the gate and the source as well as between the drain and the source of each of the fifth NMOS transistor NM45 and the fifth PMOS transistor PM45.

As described above, while the first and sixth control signal generator 221 operates to generate the first and sixth control signals CTRP1 and CTRN3, voltages lower than about 10 volts corresponding to a gate-source breakdown voltage and a drain-source breakdown voltage of the medium voltage MOS transistors may be applied between the gate and the source as well as between the drain and the source of each of the first to fifth NMOS transistors NM41 to NM5 and the first to fifth PMOS transistors PM41 to PM5 constituting the first and sixth control signal generator 221. Thus, the first and sixth control signal generator 221 may be realized using only medium voltage MOS transistors without use of high voltage MOS transistors having a high drain junction breakdown voltage of about 18 volts.

Figure 10:
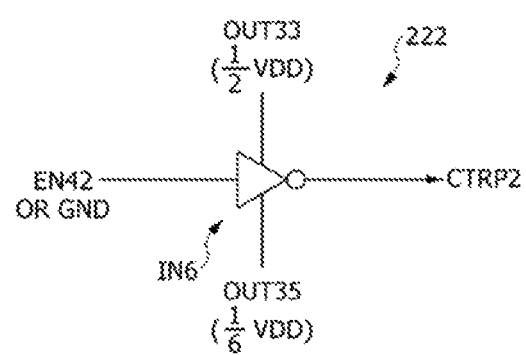
FIG. 10 is a logic circuit diagram illustrating an example configuration of the second control signal generator of FIG. 6, according to an embodiment of the present invention.
Figure 11:
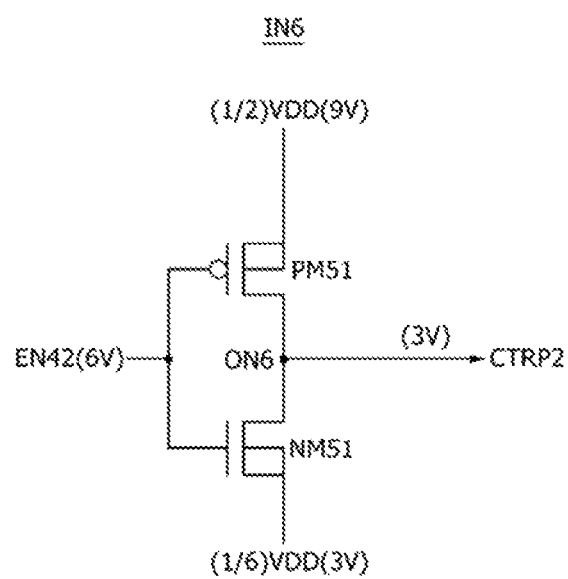
FIGS. 11 and 12 are circuit diagrams illustrating operations of the second control signal generator shown in FIG. 10, according to an embodiment of the present invention.
Figure 12:
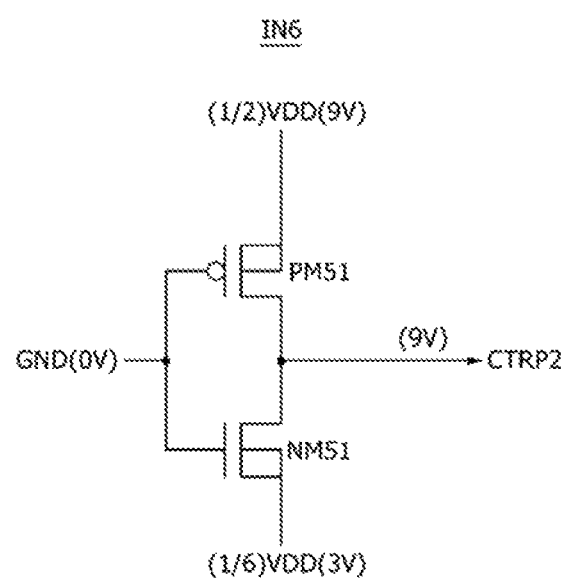

FIG. 10 is a logic circuit diagram illustrating an example of the second control signal generator 222 of FIG. 6, according to an embodiment of the present invention. FIGS. 11 and 12 are circuit diagrams illustrating operations of the second control signal generator 222.

Referring to FIGS. 10 to 12, the second control signal generator 222 may include a single inverter, namely a sixth inverter IN6. The sixth inverter IN6 may receive the second enablement signal EN42 or the ground voltage GND. The second control signal CTRP2 may be outputted through an output node of the sixth inverter IN6. The sixth inverter IN6 may be realized using a CMOS inverter. The sixth inverter IN6 may include a PMOS transistor PM51 and an NMOS transistor NM51 which are coupled in series between the third output node OUT33 and the fifth output node OUT35 of the bias generator 210. A transconductance of the NMOS transistor NM51 may be greater than a transconductance of the PMOS transistor PM51. In such a case, an area occupied by the NMOS transistor NM51 may be greater than an area occupied by the PMOS transistor PM51. A source and a bulk of the NMOS transistor NM51 may be coupled to each other. Thus, the same bias may be applied to the source and the bulk of the NMOS transistor NM51. A source and a bulk of the PMOS transistor PM51 may be coupled to each other. Thus, the same bias may be applied to the source and the bulk of the PMOS transistor PM51. Gates of the NMOS transistor NM51 and the PMOS transistor PM51 may be commonly coupled to a single input line. The source of the NMOS transistor NM51 may be coupled to the fifth output node OUT35. Thus, the fifth divided supply voltage VDD/6 may be applied to the source of the NMOS transistor NM51. The source of the PMOS transistor PM51 may be coupled to the third output node OUT33. Thus, the third divided supply voltage 0.5×VDD may be applied to the source of the PMOS transistor PM51. Drains of the NMOS transistor NM51 and the PMOS transistor PM51 may be coupled to each other to constitute an output node ON6 of the sixth inverter IN6.

As illustrated in FIG. 11, when the first supply voltage VDD is 18 volts and the second enablement signal EN42 of 6 volts is applied to the input node of the sixth inverter IN6, the gate of the NMOS transistor NM51 may have a voltage that is higher than the bulk of the NMOS transistor NM51 by 3 volts and the gate of the PMOS transistor PM51 may have a voltage level lower than the bulk of the PMOS transistor PM51 by 3 volts. Since the transconductance of the NMOS transistor NM51 is greater than the transconductance of the PMOS transistor PM51, 3 volts corresponding to the fifth divided supply voltage VDD/6 applied to the source of the NMOS transistor NM51 may be outputted through the output node ON6 of the sixth inverter IN6. The fifth divided supply voltage VDD/6 (i.e., 3 volts) outputted from the output node ON6 of the sixth inverter IN6 may be used as the second control signal CTRP2.

In such a case, a voltage difference between the gate and the source of the NMOS transistor NM51 may be 3 volts, and a voltage difference between the drain and the source of the NMOS transistor NM51 may be 0 volt. In addition, a voltage difference between the gate and the source of the PMOS transistor PM51 may be 3 volts, and a voltage difference between the drain and the source of the PMOS transistor PM51 may be 6 volts. Accordingly, voltages lower than about 10 volts corresponding to a gate-source breakdown voltage and a drain-source breakdown voltage of the medium voltage MOS transistors may be applied between the gate and the source as well as between the drain and the source of each of the NMOS transistor NM51 and the PMOS transistor PM51.

As Illustrated in FIG. 12, when the first supply voltage VDD is 18 volts and the ground voltage GND is applied to the input node of the sixth inverter IN6, the gate of the NMOS transistor NM51 may have a voltage level lower than the bulk of the NMOS transistor NM51 by 3 volts and the gate of the PMOS transistor PM51 may have a voltage level lower than the bulk of the PMOS transistor PM51 by 9 volts. Thus, the NMOS transistor NM51 may be turned off, and the PMOS transistor PM51 may be turned on. As a result, 9 volts corresponding to the third divided supply voltage 0.5×VDD applied to the source of the PMOS transistor PM51 may be outputted through the output node ON6 of the sixth inverter IN6. The third divided supply voltage 0.5×VDD (i.e., 9 volts) outputted from the output node ON6 of the sixth inverter IN6 may be used as the second control signal CTRP2.

In such a case, a voltage difference between the gate and the source of the NMOS transistor NM51 may be 3 volts, and a voltage difference between the drain and the source of the NMOS transistor NM51 may be 6 volts. In addition, a voltage difference between the gate and the source of the PMOS transistor PM51 may be 9 volts, and a voltage difference between the drain and the source of the PMOS transistor PM51 may be 0 volt. Accordingly, voltages lower than about 10 volts corresponding to a gate-source breakdown voltage and a drain-source breakdown voltage of the medium voltage MOS transistors may be applied between the gate and the source as well as between the drain and the source of each of the NMOS transistor NM51 and the PMOS transistor PM51. Thus, the second control signal generator 222 may be realized using only medium voltage MOS transistors without use of high voltage MOS transistors having a high drain junction breakdown voltage of about 18 volts.

Figure 13:
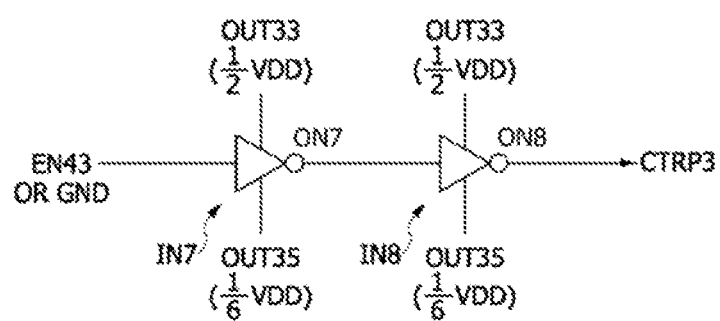
FIG. 13 is a logic circuit diagram illustrating a third control signal generator included in the control signal generator of FIG. 6, according to an embodiment of the present invention.
Figure 14:
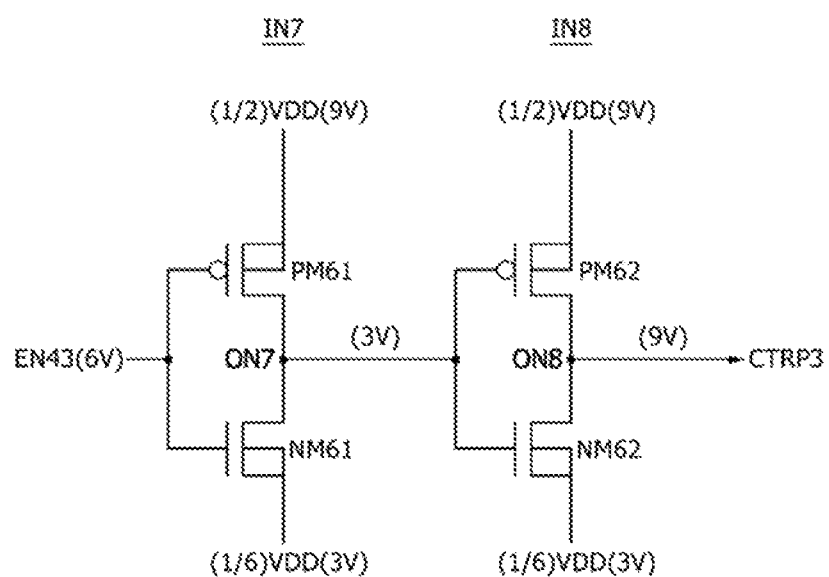
FIGS. 14 and 15 are circuit diagrams illustrating operations of the third control signal generator shown in FIG. 13, according to an embodiment of the present invention.
Figure 15:
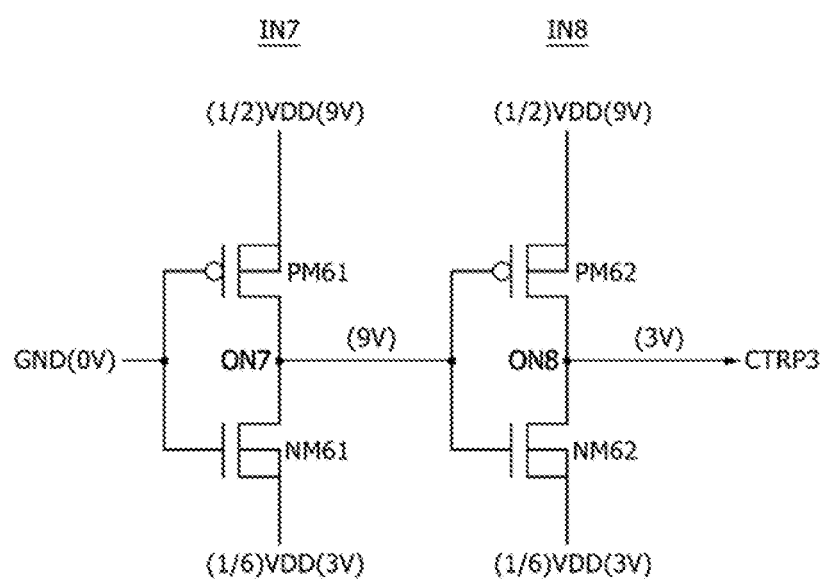

FIG. 13 is a logic circuit diagram illustrating an example of the third control signal generator 223 of FIG. 6, according to an embodiment of the invention. FIGS. 14 and 15 are circuit diagrams illustrating operations of the third control signal generator 223, according to an embodiment of the invention.

Referring to FIGS. 13 to 15, the third control signal generator 223 may include two inverters cascaded in series, namely seventh and eight inverters IN7 and IN8.

The seventh inverter IN7 may receive the third enablement signal EN43 or the ground voltage GND. An output node ON7 of the seventh inverter IN7 may be directly coupled to an input node of the eighth inverter IN8. The third control signal CTRP3 may be outputted through an output node ON8 of the eighth inverter IN8. Each of the seventh and eight inverters IN7 and IN8 may be realized using a CMOS inverter.

The seventh inverter IN7 may include a PMOS transistor PM61 and an NMOS transistor NM61 which are coupled in series between the third output node OUT33 and the fifth output node OUT35 of the bias generator 210. A transconductance of the NMOS transistor NM61 may be greater than a transconductance of the PMOS transistor PM61. In such a case, an area occupied by the NMOS transistor NM61 may be greater than an area occupied by the PMOS transistor PM61. A source and a bulk of the NMOS transistor NM61 may be coupled to each other. Thus, the same bias may be applied to the source and the bulk of the NMOS transistor NM61. A source and a bulk of the PMOS transistor PM61 may also be coupled to each other. Thus, the same bias may be applied to the source and the bulk of the PMOS transistor PM61. Gates of the NMOS transistor NM61 and the PMOS transistor PM61 may be commonly coupled to a single input line. The source of the NMOS transistor NM61 may be coupled to the fifth output node OUT35. Thus, the fifth divided supply voltage VDD/6 may be applied to the source of the NMOS transistor NM61. The source of the PMOS transistor PM61 may be coupled to the third output node OUT33. Thus, the third divided supply voltage 0.5×VDD may be applied to the source of the PMOS transistor PM61. Drains of the NMOS transistor NM61 and the PMOS transistor PM61 may be coupled to each other to constitute an output node ON7 of the seventh inverter IN7.

The eighth inverter IN8 may include a PMOS transistor PM62 and an NMOS transistor NM62 which are coupled in series between the third output node OUT33 and the fifth output node OUT35 of the bias generator 210. A transconductance of the NMOS transistor NM62 may be greater than a transconductance of the PMOS transistor PM62. In such a case, an area occupied by the NMOS transistor NM62 may be greater than an area occupied by the PMOS transistor PM62. A source and a bulk of the NMOS transistor NM62 may be coupled to each other. Thus, the same bias may be applied to the source and the bulk of the NMOS transistor NM62. A source and a bulk of the PMOS transistor PM62 may also be coupled to each other. Thus, the same bias may be applied to the source and the bulk of the PMOS transistor PM62. Gates of the NMOS transistor NM62 and the PMOS transistor PM62 may be coupled to the output node ON7 of the seventh inverter IN7. The source of the NMOS transistor NM62 may be coupled to the fifth output node OUT35. Thus, the fifth divided supply voltage VDD/6 may be applied to the source of the NMOS transistor NM62. The source of the PMOS transistor PM62 may be coupled to the third output node OUT33. Thus, the third divided supply voltage 0.5×VDD may be applied to the source of the PMOS transistor PM62. Drains of the NMOS transistor NM62 and the PMOS transistor PM62 may be coupled to each other to constitute an output node ON8 of the eighth inverter IN8, and the third control signal CTRP3 may be outputted through the output node of the eighth inverter IN8.

As illustrated in FIG. 14, when the first supply voltage VDD is 18 volts and the third enablement signal EN43 of 6 volts is applied to the input node of the seventh inverter IN7, the gate of the NMOS transistor NM61 may have a voltage level higher than the bulk of the NMOS transistor NM61 by 3 volts and the gate of the PMOS transistor PM61 may have a voltage level lower than the bulk of the PMOS transistor PM61 by 3 volts. Since the transconductance of the NMOS transistor NM61 is greater than the transconductance of the PMOS transistor PM61, 3 volts corresponding to the fifth divided supply voltage VDD/6 applied to the source of the NMOS transistor NM61 may be outputted through the output node ON7 of the seventh inverter IN7.

In such a case, a voltage difference between the gate and the source of the NMOS transistor NM61 may be 3 volts, and a voltage difference between the drain and the source of the NMOS transistor NM61 may be 0 volt. In addition, a voltage difference between the gate and the source of the PMOS transistor PM61 may be 3 volts, and a voltage difference between the drain and the source of the PMOS transistor PM61 may be 6 volts. Accordingly, voltages lower than about 10 volts corresponding to a gate-source breakdown voltage and a drain-source breakdown voltage of the medium voltage MOS transistors may be applied between the gate and the source as well as between the drain and the source of each of the NMOS transistor NM61 and the PMOS transistor PM61.

An output voltage of 3 volts of the seventh inverter IN7 may be applied to the input node of the eighth inverter IN8. Thus, the gate of the NMOS transistor NM62 may have a voltage equal to that of the bulk of the NMOS transistor NM62, and the gate of the PMOS transistor PM62 may have a voltage lower than the bulk of the PMOS transistor PM62 by 6 volts. As a result, the NMOS transistor NM62 may be turned off, and the PMOS transistor PM62 may be turned on. Accordingly, 9 volts corresponding to the third divided supply voltage 0.5×VDD applied to the source of the PMOS transistor PM62 may be outputted through the output node ON8 of the eighth inverter IN8. The third divided supply voltage 0.5×VDD (i.e., 9 volts) outputted through the output node ON8 of the eighth inverter IN8 may be used as the third control signal CTRP3.

In such a case, a voltage difference between the gate and the source of the NMOS transistor NM62 may be 0 volt, and a voltage difference between the drain and the source of the NMOS transistor NM62 may be 6 volts. In addition, a voltage difference between the gate and the source of the PMOS transistor PM62 may be 6 volts, and a voltage difference between the drain and the source of the PMOS transistor PM62 may be 0 volt. Accordingly, voltages lower than about 10 volts corresponding to a gate-source breakdown voltage and a drain-source breakdown voltage of the medium voltage MOS transistors may be applied between the gate and the source as well as between the drain and the source of each of the NMOS transistor NM62 and the PMOS transistor PM62.

As illustrated in FIG. 15, when the first supply voltage VDD is 18 volts and the ground voltage GND is applied to the input node of the seventh inverter IN7, the gate of the NMOS transistor NM61 may have a voltage lower than the bulk of the NMOS transistor NM61 by 3 volts and the gate of the PMOS transistor PM61 may have a voltage lower than the bulk of the PMOS transistor PM61 by 9 volts. Thus, the NMOS transistor NM61 may be turned off, and the PMOS transistor PM61 may be turned on. As a result, 9 volts corresponding to the third divided supply voltage 0.5×VDD applied to the source of the PMOS transistor PM61 may be outputted through the output node ON7 of the seventh inverter IN7.

In such a case, a voltage difference between the gate and the source of the NMOS transistor NM61 may be 3 volts, and a voltage difference between the drain and the source of the NMOS transistor NM61 may be 6 volts. In addition, a voltage difference between the gate and the source of the PMOS transistor PM61 may be 9 volts, and a voltage difference between the drain and the source of the PMOS transistor PM61 may be 0 volt. Accordingly, voltages lower than about 10 volts corresponding to a gate-source breakdown voltage and a drain-source breakdown voltage of the medium voltage MOS transistors may be applied between the gate and the source as well as between the drain and the source of each of the NMOS transistor NM61 and the PMOS transistor PM61.

An output voltage of 9 volts of the seventh inverter IN7 may be applied to the input node of the eighth inverter IN8. Thus, the gate of the NMOS transistor NM62 may have a voltage higher than the bulk of the NMOS transistor NM62 by 6 volts, and the gate of the PMOS transistor PM62 may have a voltage equal to that of the bulk of the PMOS transistor PM62. Accordingly, the NMOS transistor NM62 may be turned on, and the PMOS transistor PM62 may be turned off. As a result, 3 volts corresponding to the fifth divided supply voltage VDD/6 applied to the source of the NMOS transistor NM62 may be outputted through the output node ON8 of the eighth inverter IN8. The fifth divided supply voltage VDD/6 (i.e., 3 volts) outputted from the output node of the eighth inverter IN8 may be used as the third control signal CTRP3.

In such a case, a voltage difference between the gate and the source of the NMOS transistor NM62 may be 6 volts, and a voltage difference between the drain and the source of the NMOS transistor NM62 may be 0 volt. In addition, a voltage difference between the gate and the source of the PMOS transistor PM62 may be 0 volt, and a voltage difference between the drain and the source of the PMOS transistor PM62 may be 6 volts. Accordingly, voltages lower than about 10 volts corresponding to a gate-source breakdown voltage and a drain-source breakdown voltage of the medium voltage MOS transistors may be applied between the gate and the source as well as between the drain and the source of each of the NMOS transistor NM62 and the PMOS transistor PM62. Thus, the third control signal generator 223 may be realized using only the medium voltage MOS transistors without use of high voltage MOS transistors having a high drain junction breakdown voltage of about 18 volts.

Figure 16:
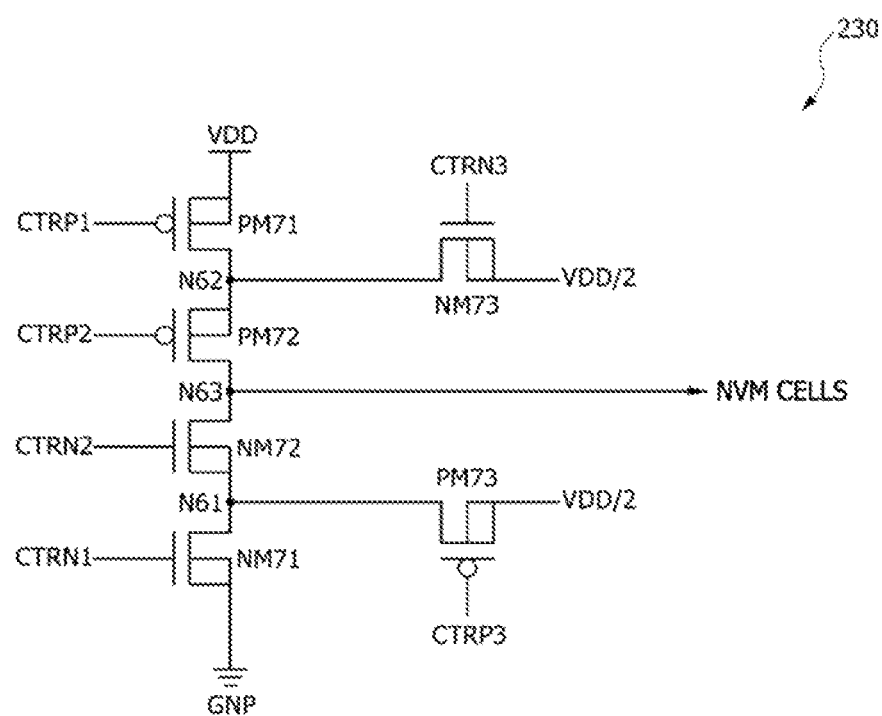
FIG. 16 is a circuit diagram illustrating a cell switching circuit included in the voltage supply device of FIG. 4, according to an embodiment of the present invention.

FIG. 16 is a circuit diagram illustrating an example of a cell switching circuit 230 included in the voltage supply device 200, according to an embodiment of the invention.

Referring to FIG. 16, the cell switching circuit 230 may include first to third NMOS transistors NM71 to NM73 and first to third PMOS transistors PM71 to PM73.

The first PMOS transistor PM71, the second PMOS transistor PM72, the second NMOS transistor NM72 and the first NMOS transistor NM71 may be coupled in series between the first supply voltage VDD and the ground voltage GND. The fourth control signal CTRN1 and the ground voltage GND may be applied to a gate and a source of the first NMOS transistor NM71, respectively. A drain of the first NMOS transistor NM71 may be coupled to a source of the second NMOS transistor NM72 through a first node N61. The fifth control signal CTRN2 may be applied to a gate of the second NMOS transistor NM72. The first control signal CTRP1 and the first supply voltage VDD may be applied to a gate and a source of the first PMOS transistor PM71, respectively. A drain of the first PMOS transistor PM71 may be coupled to a source of the second PMOS transistor PM72 through a second node N62. The second control signal CTRP2 may be applied to a gate of the second PMOS transistor PM72. A drain of the second PMOS transistor PM72 may be coupled to a drain of the second NMOS transistor NM72 through a third node N63.

The third PMOS transistor PM73 may be coupled between the first node N61 and a second supply voltage VDD/2. In some embodiments, the second supply voltage VDD/2 may be a half of the first supply voltage VDD. The third control signal CTRP3 and the second supply voltage VDD/2 may be applied to a gate and a source of the third PMOS transistor PM73, respectively. A drain of the third PMOS transistor PM73 may be coupled to the first node N61.

The third NMOS transistor NM73 may be coupled between the second node N62 and a third supply voltage VDD/2. In some embodiments, the third supply voltage VDD/2 may be a half of the first supply voltage VDD. That is, the third supply voltage VDD/2 may be equal to the second supply voltage VDD/2. The sixth control signal CTRN3 and the third supply voltage VDD/2 may be applied to a gate and a source of the third NMOS transistor NM73, respectively. A drain of the third NMOS transistor NM73 may be coupled to the second node N62. The third node N63 may be coupled to an output line of the cell switching circuit 230.

An output voltage on the output line of the cell switching circuit 230 may be supplied to the NVM cells. The source and the bulk of each of the first to third NMOS transistors NM71 to NM73 and the first to third PMOS transistors PM71 to PM73 may be coupled to each other. Thus, the same bias is applied to the source and the bulk of each of the first to third NMOS transistors NM71 to NM73 and the first to third PMOS transistors PM71 to PM73.

Figure 17:
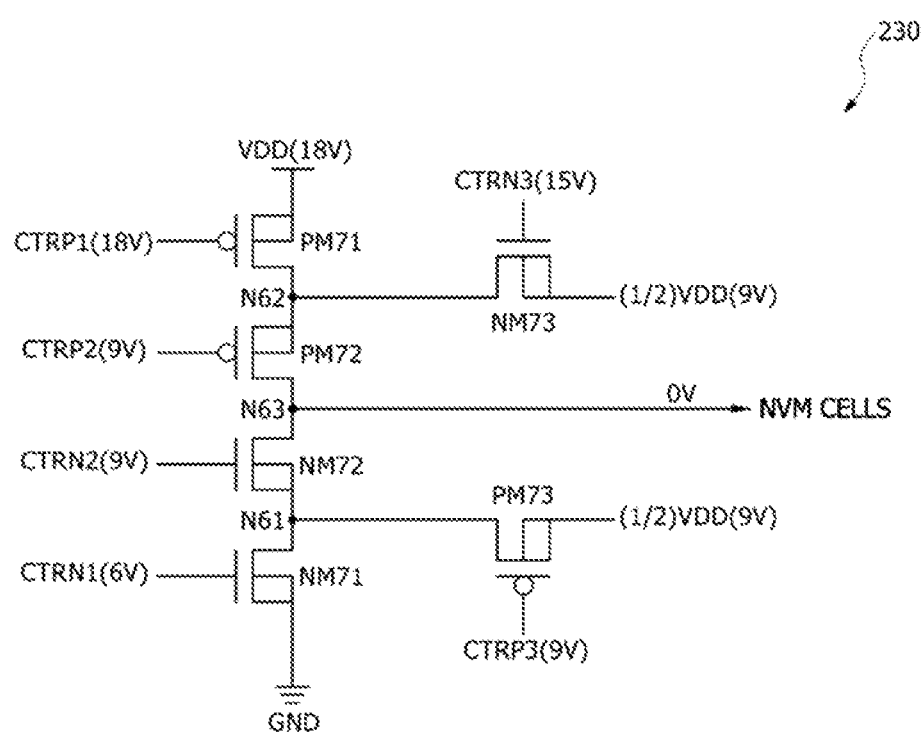
FIG. 17 is a circuit diagram illustrating an operation of the cell switching circuit of FIG. 16, according to an embodiment of the present invention.

FIG. 17 is a circuit diagram illustrating an operation of the cell switching circuit 230 of FIG. 16, according to an embodiment of the invention. FIG. 17 shows the cell switching circuit 230 providing the ground voltage GND to the NVM cells.

Referring to FIG. 17, in order to supply the ground voltage to the NVM cells when the first supply voltage VDD is 18 volts, the first control signal CTRP1 of 18 volts may be applied to the gate of the first PMOS transistor PM71, the second control signal CTRP2 of 9 volts may be applied to the gate of the second PMOS transistor PM72, and the third control signal CTRP3 of 9 volts may be applied to the gate of the third PMOS transistor PM73. In addition, the fourth control signal CTRN1 of 6 volts may be applied to the gate of the first NMOS transistor NM71, the fifth control signal CTRN2 of 9 volts may be applied to the gate of the second NMOS transistor NM72, and the sixth control signal CTRN3 of 15 volts may be applied to the gate of the third NMOS transistor NM73.

Under the above bias condition, all of the first to third NMOS transistors NM71, NM72 and NM73 may be turned on while all of the first to third PMOS transistors PM71, PM72 and PM73 are turned off. Thus, the ground voltage GND may be applied to the third node N63 through the turned on first and second NMOS transistors NM71 and NM72, and the ground voltage GND may be supplied to the NVM cells through the output line coupled to the third node N63. Since the third NMOS transistor NM73 is turned on, the third supply voltage VDD/2 applied to the source of the third NMOS transistor NM73 may be transmitted to the second node N62.

As a result of the above operation, voltage differences of 6 volts and 0 volt may be respectively generated between the gate and the source as well as between the drain and source of the first NMOS transistor NM71, voltage differences of 9 volts and 0 volt may be respectively generated between the gate and the source as well as between the drain and source of the second NMOS transistor NM72, voltage differences of 6 volts and 0 volt may be respectively generated between the gate and the source as well as between the drain and source of the third NMOS transistor NM73, voltage differences of 0 volt and 9 volts may be respectively generated between the gate and the source as well as between the drain and source of the first PMOS transistor PM71, voltage differences of 0 volt and 9 volts may be respectively generated between the gate and the source as well as between the drain and source of the second PMOS transistor PM72, and voltage differences of 0 volt and 9 volts may be respectively generated between the gate and the source as well as between the drain and source of the third PMOS transistor PM73.

Thus, during the above operation for applying the ground voltage GND to the NVM cells, voltages lower than about 10 volts corresponding to a gate-source breakdown voltage and a drain-source breakdown voltage of the medium voltage MOS transistors may be applied between the gate and the source as well as between the drain and the source of each of the first to third NMOS transistors NM71 to NM73 and the first to third PMOS transistors PM71 to PM73.

Figure 18:
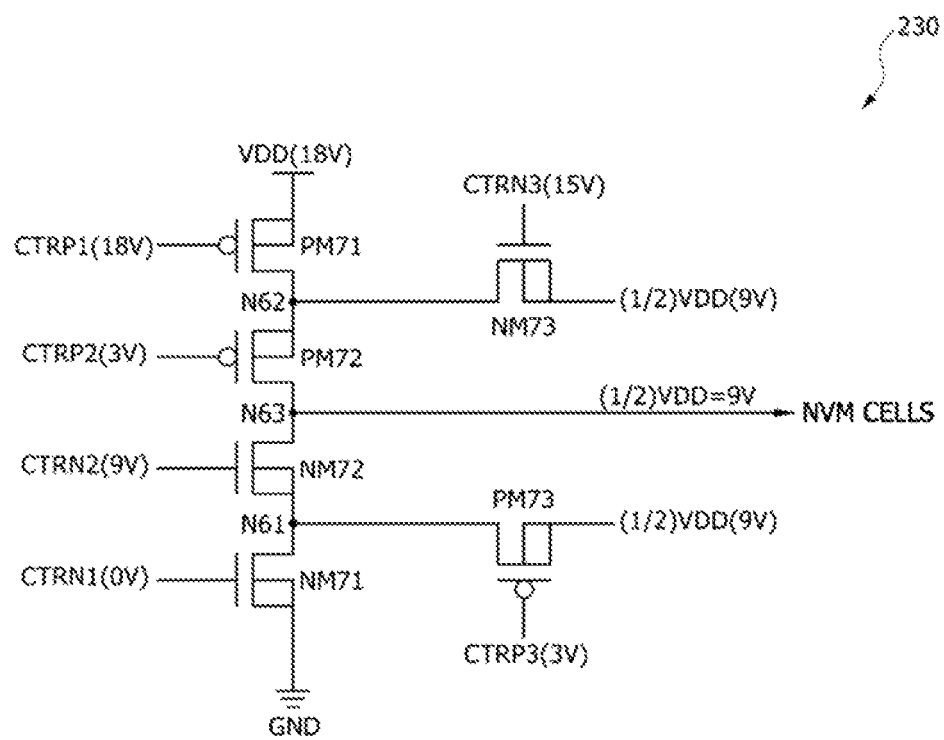
FIG. 18 is a circuit diagram illustrating an operation of the cell switching circuit of FIG. 16, according to an embodiment of the present invention.

FIG. 18 is a circuit diagram illustrating an operation of the cell switching circuit 230. FIG. 18 shows the cell switching circuit 230 providing the third supply voltage VDD/2 to the NVM cells.

Referring to FIG. 18, in order to supply the third supply voltage VDD/2 (i.e., 9 volts) to the NVM cells when the first supply voltage VDD is 18 volts, the first control signal CTRP1 of 18 volts may be applied to the gate of the first PMOS transistor PM71, the second control signal CTRP2 of 3 volts may be applied to the gate of the second PMOS transistor PM72, and the third control signal CTRP3 of 3 volts may be applied to the gate of the third PMOS transistor PM73. In addition, the fourth control signal CTRN1 of the ground voltage GND (i.e., 0 volt) may be applied to the gate of the first NMOS transistor NM71, the fifth control signal CTRN2 of 9 volts may be applied to the gate of the second NMOS transistor NM72, and the sixth control signal CTRN3 of 15 volts may be applied to the gate of the third NMOS transistor NM73.

Under the above bias condition, the third NMOS transistor NM73 may be turned on, and the third supply voltage VDD/2 of 9 volts applied to the source of the third NMOS transistor NM73 may be transmitted to the second node N62. Thus, while the first PMOS transistor PM71 is turned off, the second PMOS transistor PM72 may be turned on. As a result, the third supply voltage VDD/2 (i.e., 9 volts) may be supplied to the NVM cells through the output line connected to the third node N63. The third PMOS transistor PM73 may also be turned on under the above bias condition. Thus, the second supply voltage VDD/2 (i.e., 9 volts) applied to the source of the third PMOS transistor PM73 may also be transmitted to the first node N61. Accordingly, the first and second NMOS transistors NM71 and NM72 may be turned off.

As a result of the above operation, voltage differences of 0 volt and 9 volts may be respectively generated between the gate and the source as well as between the drain and source of the first NMOS transistor NM71, a voltage difference of 0 volt may be generated between the gate and the source as well as between the drain and source of the second NMOS transistor NM72, voltage differences of 6 volts and 0 volt may be respectively generated between the gate and the source as well as between the drain and source of the third NMOS transistor NM73, voltage differences of 0 volt and 9 volts may be respectively generated between the gate and the source as well as between the drain and source of the first PMOS transistor PM71, voltage differences of 6 volts and 0 volt may be respectively generated between the gate and the source as well as between the drain and source of the second PMOS transistor PM72, and voltage differences of 6 volts and 0 volt may be respectively generated between the gate and the source as well as between the drain and source of the third PMOS transistor PM73.

Thus, during the above operation for applying the second supply voltage VDD/2 of 9 volts to the NVM cells, voltages lower than about 10 volts corresponding to a gate-source breakdown voltage and a drain-source breakdown voltage of the medium voltage MOS transistors may be applied between the gate and the source as well as between the drain and the source of each of the first to third NMOS transistors NM71 to NM73 and the first to third PMOS transistors PM71 to PM73.

Figure 19:
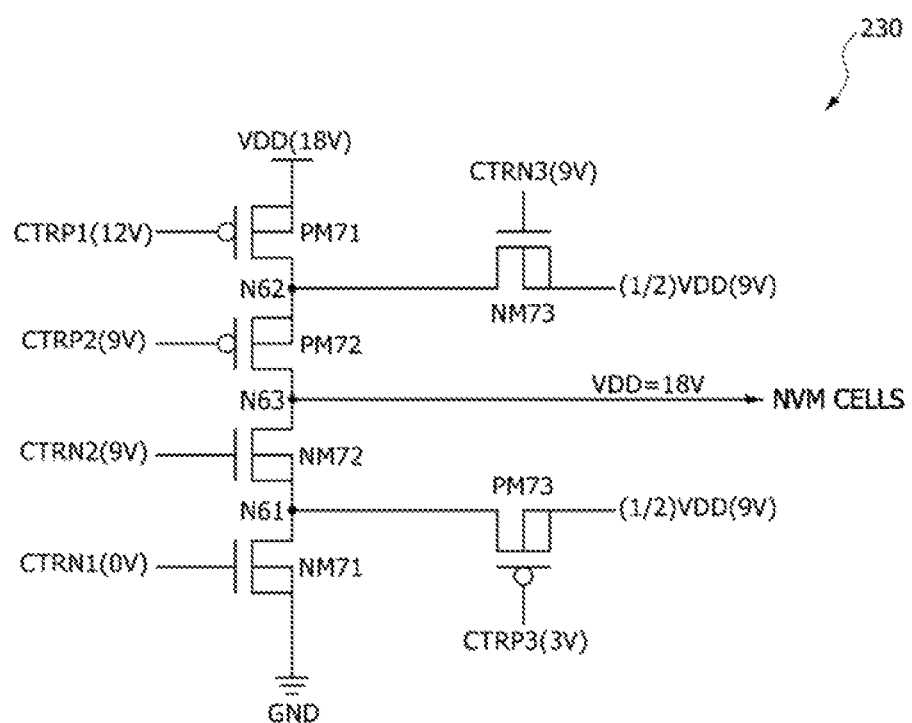
FIG. 19 is a circuit diagram illustrating an operation of the cell switching circuit of FIG. 16, according to an embodiment of the present invention.

FIG. 19 is a circuit diagram illustrating an operation of the cell switching circuit 230. FIG. 19 shows the cell switching circuit 230 providing the first supply voltage VDD to the NVM cells.

Referring to FIG. 19, in order to supply the first supply voltage VDD to the NVM cells when the first supply voltage VDD is 18 volts, the first control signal CTRP1 of 12 volts may be applied to the gate of the first PMOS transistor PM71, the second control signal CTRP2 of 9 volts may be applied to the gate of the second PMOS transistor PM72, and the third control signal CTRP3 of 3 volts may be applied to the gate of the third PMOS transistor PM73. In addition, the fourth control signal CTRN1 of the ground voltage GND (i.e., 0 volt) may be applied to the gate of the first NMOS transistor NM71, the fifth control signal CTRN2 of 9 volts may be applied to the gate of the second NMOS transistor NM72, and the sixth control signal CTRN3 of 9 volts may be applied to the gate of the third NMOS transistor NM73.

Under the above bias condition, all of the first to third PMOS transistors PM71 to PM73 may be turned on while all of the first to third NMOS transistors NM71 to NM73 may be turned off. Thus, the first supply voltage VDD of 18 volts may be applied to the third node N63 through the first and second PMOS transistors PM71 and PM72 which are turned on, and the first supply voltage VDD of 18 volts may be supplied to the NVM cells through the output line coupled to the third node N63. Since the third PMOS transistor PM73 is turned on, the second supply voltage VDD/2 applied to the source of the third PMOS transistor PM73 may be transmitted to the first node N61.

As a result of the above operation, voltage differences of 0 volt and 9 volts may be respectively generated between the gate and the source as well as between the drain and source of the first NMOS transistor NM71, voltage differences of 0 volt and 9 volts may be respectively generated between the gate and the source as well as between the drain and source of the second NMOS transistor NM72, and voltage differences of 0 volt and 9 volts may be respectively generated between the gate and the source as well as between the drain and source of the third NMOS transistor NM73. Furthermore, voltage differences of 6 volts and 0 volt may be respectively generated between the gate and the source as well as between the drain and source of the first PMOS transistor PM71, voltage differences of 9 volts and 0 volt may be respectively generated between the gate and the source as well as between the drain and source of the second PMOS transistor PM72, and voltage differences of 6 volts and 0 volt may be respectively generated between the gate and the source as well as between the drain and source of the third PMOS transistor PM73.

Thus, during the above operation for applying the first supply voltage VDD (i.e., 18 volts) to the NVM cells, voltages lower than about 10 volts corresponding to a gate-source breakdown voltage and a drain-source breakdown voltage of the medium voltage MOS transistors may be applied between the gate and the source as well as between the drain and the source of each of the first to third NMOS transistors NM71 to NM73 and the first to third PMOS transistors PM71 to PM73. Thus, the cell switching circuit 230 may be realized using only medium voltage MOS transistors having a breakdown voltage of from approximately 7 volts to approximately 15 volts without use of high voltage MOS transistors having a high drain junction breakdown voltage of about 18 volts.

According to the embodiments described above, various different supply voltages may be supplied to the NVM cells using only medium voltage MOS transistors without use of high voltage MOS transistors.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A voltage supply device comprising:
a bias generator suitable for dividing a first supply voltage to output a plurality of divided supply voltages;
a control signal generator suitable for receiving the plurality of divided supply voltages to generate a plurality of control signals; and
a cell switching circuit suitable for receiving the plurality of control signals to provide nonvolatile memory cells with one or more of a ground voltage, the first supply voltage and a second supply voltage different from the first supply voltage,
wherein each of the bias generator, the control signal generator and the cell switching circuit is implemented with medium voltage MOS transistors having a breakdown voltage of from approximately 7 volts to approximately 15 volts.

2. The voltage supply device of claim 1, wherein the bias generator includes:
a first NMOS transistor coupled to a ground voltage; and
a plurality of resistors coupled in series between the first NMOS transistor and the first supply voltage.

3. The voltage supply device of claim 2,
wherein the plurality of resistors have substantially the same resistance value, and
wherein the plurality of divided supply voltages are outputted through output nodes coupled between the plurality of resistors, respectively.

4. The voltage supply device of claim 2, wherein a source and a bulk of the first NMOS transistor are coupled to each other.

5. The voltage supply device of claim 1,
wherein the number of the plurality of resistors is six,
wherein the plurality of resistors have substantially the same resistance value, and
wherein the plurality of divided supply voltages include a first divided supply voltage which is five sixth the first supply voltage, a second divided supply voltage which is two third the first supply voltage, a third divided supply voltage which is a half of the first supply voltage, a fourth divided supply voltage which is one third the first supply voltage, and a fifth divided supply voltage which is one sixth the first supply voltage.

6. The voltage supply device of claim 5, wherein the control signal generator includes:
a first and sixth control signal generator suitable for receiving the ground voltage, a first enablement signal, the first supply voltage, and the first to fifth divided supply voltages to output first and sixth control signals among the plurality of control signals;
a second control signal generator suitable for receiving the ground voltage, a second enablement signal, the third divided supply voltage and the fifth divided supply voltage to output a second control signal among the plurality of control signals; and
a third control signal generator suitable for receiving the ground voltage, a third enablement signal, the third divided supply voltage and the fifth divided supply voltage to output a third control signal among the plurality of control signals.

7. The voltage supply device of claim 6, wherein the control signal generator outputs the third divided supply voltage as a fifth control signal among the plurality of control signals, and outputs the third enablement signal as a fourth control signal among the plurality of control signals.

8. The voltage supply device of claim 6, wherein the first and third enablement signals have the same voltage level as the fourth divided supply voltage.

9. The voltage supply device of claim 8, wherein the first and sixth control signal generator includes:
a first inverter suitable for receiving the first enablement signal or the ground voltage;
a second inverter having an input node coupled to an output node of the first inverter;
a third inverter having an input node coupled to an output node of the second inverter;
a fourth inverter having an input node coupled to an output node of the third inverter; and
a fifth inverter having an input node coupled to an output node of the fourth inverter,
wherein the first and sixth control signals are outputted through the output node of the fifth inverter and the output node of the third inverter, respectively.

10. The voltage supply device of claim 9,
wherein the first inverter includes a first PMOS transistor having a source to which the third divided supply voltage is applied, and a second NMOS transistor having a source to which the fifth divided supply voltage is applied,
wherein the second inverter includes a second PMOS transistor having a source to which the second divided supply voltage is applied, and a third NMOS transistor having a source to which the fourth divided supply voltage is applied,
wherein the third inverter includes a third PMOS transistor having a source to which the first divided supply voltage is applied, and a fourth NMOS transistor having a source to which the third divided supply voltage is applied,
wherein the fourth inverter includes a fourth PMOS transistor having a source to which the first supply voltage is applied, and a fifth NMOS transistor having a source to which the second divided supply voltage is applied, and
wherein the fifth inverter includes a fifth PMOS transistor having a source to which the first supply voltage is applied, and a sixth NMOS transistor having a source to which the second divided supply voltage is applied.

11. The voltage supply device of claim 10, wherein the source and a bulk of each of the second to sixth NMOS transistors and the first to fifth PMOS transistors are coupled to each other.

12. The voltage supply device of claim 11,
wherein the second NMOS transistor has a transconductance greater than that of the first PMOS transistor,
wherein the third NMOS transistor has a transconductance greater than that of the second PMOS transistor,
wherein the fourth NMOS transistor has a transconductance greater than that of the third PMOS transistor,
wherein the fifth NMOS transistor has a transconductance greater than that of the fourth PMOS transistor, and
wherein the sixth NMOS transistor has a transconductance greater than that of the fifth PMOS transistor.

13. The voltage supply device of claim 8,
wherein the second control signal generator includes a sixth inverter suitable for receiving the second enablement signal or the ground voltage to output the second control signal, and
wherein the sixth inverter includes a sixth PMOS transistor having a source to which the third divided supply voltage is applied, and a seventh NMOS transistor having a source to which the fifth divided supply voltage is applied.

14. The voltage supply device of claim 13, wherein a source and a bulk of each of the sixth PMOS transistor and the seventh NMOS transistor are coupled to each other.

15. The voltage supply device of claim 14, wherein the seventh NMOS transistor has a transconductance greater than that of the sixth PMOS transistor.

16. The voltage supply device of claim 8, wherein the third control signal generator includes:
a seventh inverter suitable for receiving the third enablement signal or the ground voltage; and
an eight inverter having an input node coupled to an output node of the seventh inverter,
wherein the third control signal is outputted through an output node of the eighth inverter.

17. The voltage supply device of claim 16,
wherein the seventh inverter includes a seventh PMOS transistor having a source to which the third divided supply voltage is applied, and an eighth NMOS transistor having a source to which the fifth divided supply voltage is applied, and
wherein the eighth inverter includes an eighth PMOS transistor having a source to which the third divided supply voltage is applied, and a ninth NMOS transistor having a source to which the fifth divided supply voltage is applied.

18. The voltage supply device of claim 17, wherein a source and a bulk of each of the seventh and eight PMOS transistors and the eighth and nine NMOS transistors are coupled to each other.

19. The voltage supply device of claim 18,
wherein the eight NMOS transistor has a transconductance greater than that of the seventh PMOS transistor, and
wherein the ninth NMOS transistor has a transconductance greater than that of the eighth PMOS transistor.

20. The voltage supply device of claim 8, wherein the cell switching circuit includes:
a tenth NMOS transistor having a gate to which the fourth control signal is applied, a drain coupled to a first node, and a source coupled to the ground voltage;
an eleventh NMOS transistor having a gate to which the fifth control signal is applied, a drain coupled to a third node, and a source coupled to the first node;
a twelfth NMOS transistor having a gate to which the sixth control signal is applied, a drain coupled to a second node, and a source coupled to the second supply voltage;
a ninth PMOS transistor having a gate to which the first control signal is applied, a drain coupled to the second node, and a source coupled to the first supply voltage;
a 10th PMOS transistor having a gate to which the second control signal is applied, a drain coupled to the third node, and a source coupled to the second node; and
an 11th PMOS transistor having a gate to which the third control signal is applied, a drain coupled to the first node, and a source coupled to a third supply voltage.

21. The voltage supply device of claim 20, wherein the second and third supply voltages have a voltage level which is a half of the first supply voltage.

22. The voltage supply device of claim 21, wherein a source and a bulk of each of the tenth to twelfth NMOS transistors and the ninth to eleventh PMOS transistors are coupled to each other.

23. The voltage supply device of claim 22,
further comprising an output line coupled to the third node,
wherein any one of the ground voltage, the first supply voltage and the second supply voltage is selectively transmitted to the nonvolatile memory cells through the output line.

* * * * *